(12) United States Patent
Oprescu

(10) Patent No.: US 6,603,812 B1
(45) Date of Patent: Aug. 5, 2003

(54) HARDWARE IMPLEMENTATION OF A DECIMATING FINITE IMPULSE RESPONSE FILTER

(75) Inventor: Florin A. Oprescu, Sunnyvale, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 09/135,229

(22) Filed: Aug. 17, 1998

(51) Int. Cl.$^7$ .............................. H03H 7/30; H03H 7/40; H03K 5/159
(52) U.S. Cl. ........................................ 375/232; 708/300
(58) Field of Search .................................. 375/229, 230, 375/232, 254, 285, 346, 350; 708/300, 315, 322, 420

(56) References Cited

U.S. PATENT DOCUMENTS

| | | | |
|---|---|---|---|
| 4,872,129 A | * 10/1989 | Pfeifer et al. | |
| 5,357,252 A | * 10/1994 | Ledzius et al. | 341/143 |
| 5,408,235 A | * 4/1995 | Doyle et al. | 341/143 |
| 5,903,232 A | * 5/1999 | Zarubinsky et al. | 341/61 |

OTHER PUBLICATIONS

Steven R. Norsworthy et al., "Decimation and Interpolation for ΔΣ Conversion," Delta–Sigma Data Converters, Steven R. Norsworthy et al. eds., Ch. 13, pp. 406–444, IEEE Press 1997.

James C. Candy et al., "Oversampling Methods for A/D and D/A Conversion," Oversampling Delta–Sigma Converters, Steven R. Norsworthy et al. eds., pp. 1–25, IEEE Press 1992.

Max W. Hauser, "Principles of Oversampling A/D Conversion," J. Audio Eng. Soc., vol. 39, No. 1/2, pp. 3–26, Jan./Feb. 1991.

Hanafy Meleis et al., "A Novel Architecture Design for VLSI Implementation of an FIR Decimation Filter," IEEE Proc. ICASSP '85, pp. 1380–1383, Mar. 1985.

James C. Candy et al., "Using Triangularly Weighted Interpolation to Get 13–Bit PCM from a Sigma–Delta Modulator," IEEE Trans. Commun., vol. COM–24, pp. 1268–1275, Nov. 1976.

\* cited by examiner

Primary Examiner—Jean Corrielus
(74) Attorney, Agent, or Firm—Fish & Neave; Jared Kneitel

(57) ABSTRACT

The invention provides apparatus and methods for generating the coefficients of a finite impulse response digital filter used in signal sample rate conversion. Sequence generation circuitry provides a discrete-time sequence x(n) that is coupled to a plurality of cascaded discrete-time integrators that generate the filter coefficients h(n). Bit serial and interleaved bit serial implementations are described that provide efficient coefficient generators. The described apparatus and methods also may be used to efficiently implement a finite impulse response digital filter for an oversampling analog-to-digital converter.

30 Claims, 15 Drawing Sheets

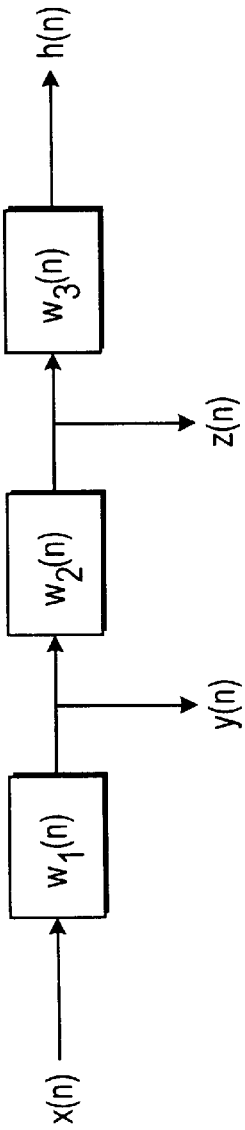

$$X(z) = \frac{1 - 4z^{-256} + 6z^{-512} - 4z^{-768} + z^{-1024}}{1-z^{-1}}$$

$$= G(z)\left(\frac{1}{1-z^{-1}}\right)$$

$$G(z) = 1 - 4z^{-256} + 6z^{-512} - 4z^{-768} + z^{-1024}$$

$g_1 = +1$
$g_2 = -4$
$g_3 = +6$
$g_4 = -4$
$g_5 = +1$ $$\therefore x(n) = \begin{array}{ll} +1 & 1 \leq n \leq 256 \\ -3 & 257 \leq n \leq 512 \\ +3 & 513 \leq n \leq 768 \\ -1 & 769 \leq n \leq 1024 \end{array}$$

$$W_1(z) = W_2(z) = W_3(z) = \left(\frac{z^{-1}}{1-z^{-1}}\right)$$

$$H(z) = z^{-3}\left(\frac{1-z^{-256}}{1-z^{-1}}\right)^4$$

$$= \left(\frac{z^{-1}}{1-z^{-1}}\right)\left(\frac{z^{-1}}{1-z^{-1}}\right)\left(\frac{z^{-1}}{1-z^{-1}}\right)X(z)$$

*FIG. 2*

| j(DECIMAL) | j(BINARY) | X(n) (BINARY) | X(n) (DECIMAL) |
|---|---|---|---|
| 0 | 0000000000 | 0000000001 | +1 |
| 1 | 0000000001 | 0000000001 | +1 |
| . | . | . | . |
| . | . | . | . |
| 255 | 0011111111 | 0000000001 | +1 |
| 256 | 0100000000 | 1111111101 | -3 |
| 257 | 0100000001 | 1111111101 | -3 |
| . | . | . | . |
| . | . | . | . |
| 511 | 0111111111 | 1111111101 | -3 |
| 512 | 1000000000 | 0000000011 | +3 |
| 513 | 1000000001 | 0000000011 | +3 |
| . | . | . | . |
| . | . | . | . |
| 767 | 1011111111 | 0000000011 | +3 |
| 768 | 1100000000 | 1111111111 | -1 |
| 769 | 1100000001 | 1111111111 | -1 |
| . | . | . | . |
| . | . | . | . |
| 1023 | 111111111 | 11111111111 | -1 |

IF COUNTER j BIT 9 = 0 AND BIT 10 = 0, X(n) = 0000000001
BIT 9 = 1 AND BIT 10 = 0, X(n) = 1111111101
BIT 9 = 0 AND BIT 10 = 1, X(n) = 0000000011
BIT 9 = 1 AND BIT 10 = 1, X(n) = 1111111111

FIG. 6

| n RANGE | i RANGE | s BIT 14 | s BIT 13 | s [BIT4 - BIT0] | Xi(n) |
|---|---|---|---|---|---|
| [1 - 256] | 0 | 0 | 0 | 0 | 1 |
| [1 - 256] | [1 - 23] | 0 | 0 | [1 - 23] | 0 |
| [257 - 512] | 1 | 0 | 1 | 1 | 0 |
| [257 - 512] | 0 AND [2 - 23] | 0 | 1 | 0, [2 - 23] | 1 |
| [513 - 768] | 0, 1 | 1 | 0 | 0, 1 | 1 |
| [513 - 768] | [2 - 23] | 1 | 0 | [2 - 23] | 0 |
| [769 - 1024] | [0 - 23] | 1 | 1 | [0 - 23] | 1 |

FIG. 8

HARDWARE IMPLEMENTATION OF A DECIMATING FINITE IMPULSE RESPONSE FILTER

FIELD OF THE INVENTION

The present invention relates to finite impulse response (FIR) digital filters used in signal sample rate conversion (i.e., decimation filters). More particularly, the present invention relates to a compact hardware implementation for an FIR decimating filter used in oversampling analog-to-digital converters.

BACKGROUND OF THE INVENTION

Decimation filters commonly are used for digital signal processing in such fields as communications, instrumentation, data acquisition, audio-video, industrial control, etc. The input signal $SIG_{in}$ to a decimation filter is a digital signal of limited bandwidth $F_s/2$, and is represented as a stream of digital samples at a rate $F_a$. The decimation filter generates an output sequence $SIG_{out}$ that is a digital signal of limited bandwidth $F_o/2$, and is represented as a stream of digital samples at a rate $F_o$. The input rate $F_s$ typically is an integer multiple of the output rate $F_o$. The decimation ration N is defined as $N=F_a/F_o$. The decimation filter operates at a clock rate $F_{elk}$ that typically is an integer multiple of both $F_s$ and $F_o$.

An FIR decimation filter is represented by a coefficient sequence h(n) having a finite length L. The filter generates output samples $S_{out}$ by convolving the input sequence $SIG_{in}$ of unbounded length with the coefficient sequence h(n). Output sequence $SIG_{out}$ is formed by selecting every N-th sample of output samples $S_{out}$. The remaining N-1 output samples $S_{out}$ are discarded.

In oversampling analog-to-digital converters, a decimation filter typically is used to lower the sampling rate of a signal generated by a delta-sigma modulator. The decimation filter also must adequately attenuate quantization noise generated by the modulator. If the analog-to-digital converter implements double integration sigma-delta modulation, a decimation filter having a $Sinc^3(N\omega T/2)$ frequency response is desirable, where $T=1/F_s$. For other analog-to-digital converter designs, decimation filters having higher order (e.g., $Sinc^4(N\omega T/2)$ and higher) frequency response are desirable.

As the filter length L increases, the size of the coefficient sequence h(n) becomes very large, and the circuitry related to it occupies a significant area. Traditionally, the sequence h(n) is stored in random access memory (RAM) or read only memory (ROM), and a dedicated state machine retrieves the coefficients from memory as necessary. Although such an approach provides flexibility with respect to coefficient values, the required circuitry is nevertheless prohibitively large for many applications. For example, an FIR filter with L=1024 and a coefficient word size of 32 bits requires a total coefficient memory of 32K bits.

To eliminate the need for a RAM or ROM storage array for the filter coefficients, investigators have proposed calculating the coefficient sequence h(n) in real-time. For example, James C. Candy et al., "Using Triangularly Weighted Interpolation to Get 13-Bit PCM from a Sigma-Delta Modulator," IEEE Trans. Commun., vol. COM-24, pp. 1268–1275, Nov. 1976, describes hardware that generates the h(n) sequence for decimation filters having $Sinc(N\omega T/2)$, $Sinc^2(N\omega T/2)$ and intermediate derivative frequency response characteristics. Candy's circuits, however, become increasingly complex and restrictive for higher order filters.

In addition, Hanafy Meleis and Pierre Le Fur, "A novel Architecture Design for VLSI Implementation of an FIR Decimation Filter," IEEE Proc. ICASSP '85, pp. 1380–1383, March 1985, describes hardware that generates the h(n) sequence for a decimation filter having a $Sinc^3(N\omega T/2)$ frequency response. The described hardware, however, is limited to a $Sinc^3(N\omega T/2)$ filter.

In view of the foregoing, it would be desirable to provide a compact hardware implementation of an FIR digital decimation filter.

It also would be desirable to provide an apparatus for generating in real-time the coefficients of a digital decimation filter for a large class of complex decimation filters, of which the $Sinc^4(N\omega T/2)$ filter is a specific example.

SUMMARY OF THE INVENTION

Accordingly, it is an object of this invention to provide a compact hardware implementation of an FIR digital decimation filter.

It also is an object of this invention to provide methods and apparatus for generating in real-time the coefficients of a digital decimation filter for a large class of complex decimation filters, of which the $Sinc^4(N\omega T/2)$ filter is a specific example.

In accordance with these and other objects of the present invention, methods and apparatus for generating coefficients of a digital decimation filter are described that use a predetermined input sequence x(n) of Length L, and generates L filter coefficients h(n). The predetermined input sequence x(n) is very simple, and may be used to generate a much more complex output sequence h(n) with minimal computational complexity.

The coefficient generator includes at least one adder and accumulator that receives the input sequence and generates the output sequence. In one exemplary embodiment, the at least one adder and accumulator includes a multi-bit adder and a multi-bit accumulator register. In a first alternative embodiment, the at least one adder and accumulator includes a binary full adder and a serial shift register. In a second alternative embodiment, the at least one adder and accumulator includes a plurality of interleaved binary full adders and serial shift registers.

In addition, methods and apparatus for digitally filtering an input sequence are described that generate the filter coefficients h(n) and perform the filtering operation in real-time.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which:

FIG. 2 is a block diagram of an exemplary architecture of the coefficient generator of the present invention;

FIG. 6 is an exemplary input sequence for the embodiment of FIG. 4;

FIG. 8 is an exemplary input sequence for the embodiment of FIG. 7;

DETAILED DESCRIPTION OF THE INVENTION

Figure 1:
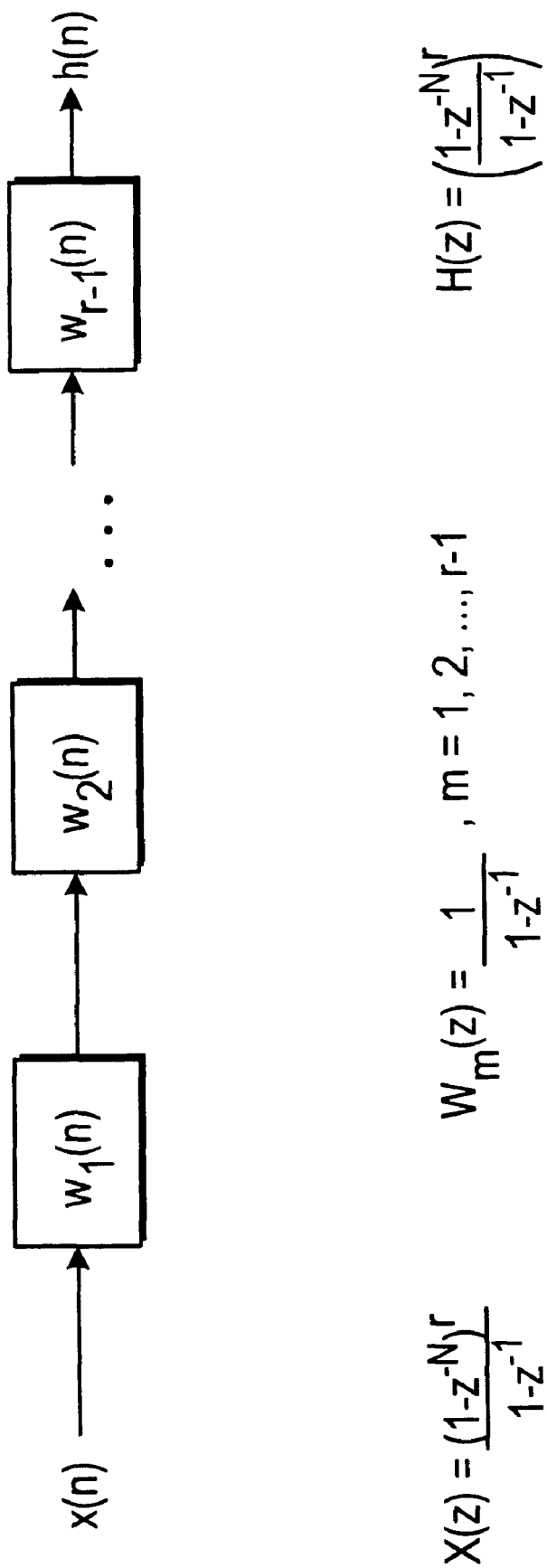
FIG. 1 is a block diagram of a $Sinc^r(N\omega T/2)$ filter coefficient generator in accordance with the present invention.

To provide background for the present invention, this written description first sets forth a mathematical description for a generic decimation filter having a $Sinc^r(N\omega T/2)$ frequency response, where r is the filter order. Based on this mathematical description, a circuit architecture is described for implementing the coefficient generator of the present invention. Preferred embodiments of coefficient generators that generate impulse response coefficients for a $Sinc^4(N\omega T/2)$ decimation filter and other similar filters are then described. Finally, a compact hardware FIR filter that includes a coefficient generator for a $Sinc^4(N\omega T/2)$ decimation filter is described.

Mathematical Description of $Sinc^r$ Decimation Filters

A digital decimation filter h(n) having a decimation ratio N, an input sampling period T and a $Sinc^r(N\omega T/2)$ frequency response has a z-domain transfer function characterized as:

$$H(z) = \left(\frac{1}{N^z}\right)\left[\frac{(1-z^{-N})}{(1-z^{-1})}\right]^r = (K)W(z) \quad (1)$$

Where $K=1/N^r$ is a constant. From equation (1), W(z) can be re-written as:

$$W(z)=W_1(z)W_2(z)\ldots W_r(z)(1-z^{-N})^r \quad (2)$$

$$=W_1(2)W_2(z)\ldots W_{r-1}(z)X(z) \quad (3)$$

where $$W_m(z) = \left(\frac{1}{1-z^{-1}}\right)$$

$$m=1,2,\ldots r-1 \quad (4)$$

and $$X(z) = \frac{(1-z^{-N})^r}{(1-z^{-1})} = G(z)\left(\frac{1}{1-z^{-1}}\right) \quad (5)$$

Each of functions $W_m(z)$ represents the z-transform of a discrete-time system $W_m(n)$ that approximates an integration function. For simplicity, as used herein, the polynomial in equation (4) will be referred to as an integrator transfer function.

X(z) is the product of a first polynomial G(z) and an integrator transfer function. If g(n) represents the impulse response corresponding to G(z) (i.e., the inverse z-transform of G(z)), and x(n) is the impulse response corresponding to X(z), x(n) may be obtained by performing the discrete-time integration or g(n).

G(z) can be expressed as:

$$G(z)=g_1+g_2z^{-N}+g_3z^{-2N}+\ldots+g_{r+1}z^{-rN} \quad (6)$$

The impulse response g(n) can be represented as:

$$g(n)=g_1\delta(n)+g_2\delta(n-N)+g_3\delta(n-2N)+\ldots+g_{r-1}\delta(n-rN) \quad (7)$$

where $\delta(n)$ is the discrete-time impulse. Performing the discrete-time integration of equation (6), the impulse response x(n) may be represented as:

$$x(n)=g_1u(n)+g_2u(n-N)+g_3u)n-2N)+\ldots+g_{r-1}u(n-rN) \quad (8)$$

$$= g_1 \qquad \text{for } 0 \leq n \leq N-1$$

$$g_1 + g_2 \qquad \text{for } N \leq n \leq 2N-1$$

$$g_1 + g_2 + g_3 \qquad \text{for } 2N \leq n \leq 3N-1$$

$$\ldots$$

$$g_1 + g_2 + \ldots + g_r \quad \text{for } (r-1)N \leq n \leq rN-1$$

Exemplary Architecture for $Sinc^r(N\omega T/2)$ Decimation Filter

The above equations can be used to develop a circuit architecture for generating the coefficients h(n) of a desired decimation filter having a $Sinc^r(N\omega T/2)$ frequency response. Note that to simplify the following discussion, the coefficients of filter h(n) are indexed from n–1 to n–L, instead of from n=0 to n=L–1. The effect of this notational change is the addition of a delay of a single sample period T, which is inconsequential for the described embodiments. Additionally, scale factor K is ignored.

Referring to FIG. 1 and equations (1)–(4), above, the coefficient sequence h(n) can be generated by applying sequence x(n) as input to r-1 cascaded discrete-time integrators $w/_m(n)$, m=1, 2, ..., r–1. As used herein, the term "discrete-time integrator" means an electronic circuit that implements an integrator transfer function like the one set forth above in equation (4). Further, as used herein, the term "cascaded discrete-time integrators" means a series of two or more discrete-time integrators, the output of each serving as the input for the next discrete-time integrator in the series.

As shown in FIG. 1, therefore, sequence x(n) composed of L=Nr values x(1), x(2), . . . , x(L) can be used to generate coefficients h(1), h(2), . . . , h(L) of an FIR decimation filter h(n) having a $Sinc^r(N\omega T/2)$ frequency response.

A Coefficient Generator for a $Sinc^4(N\omega T/2)$ Decimation Filter

Figure 3:
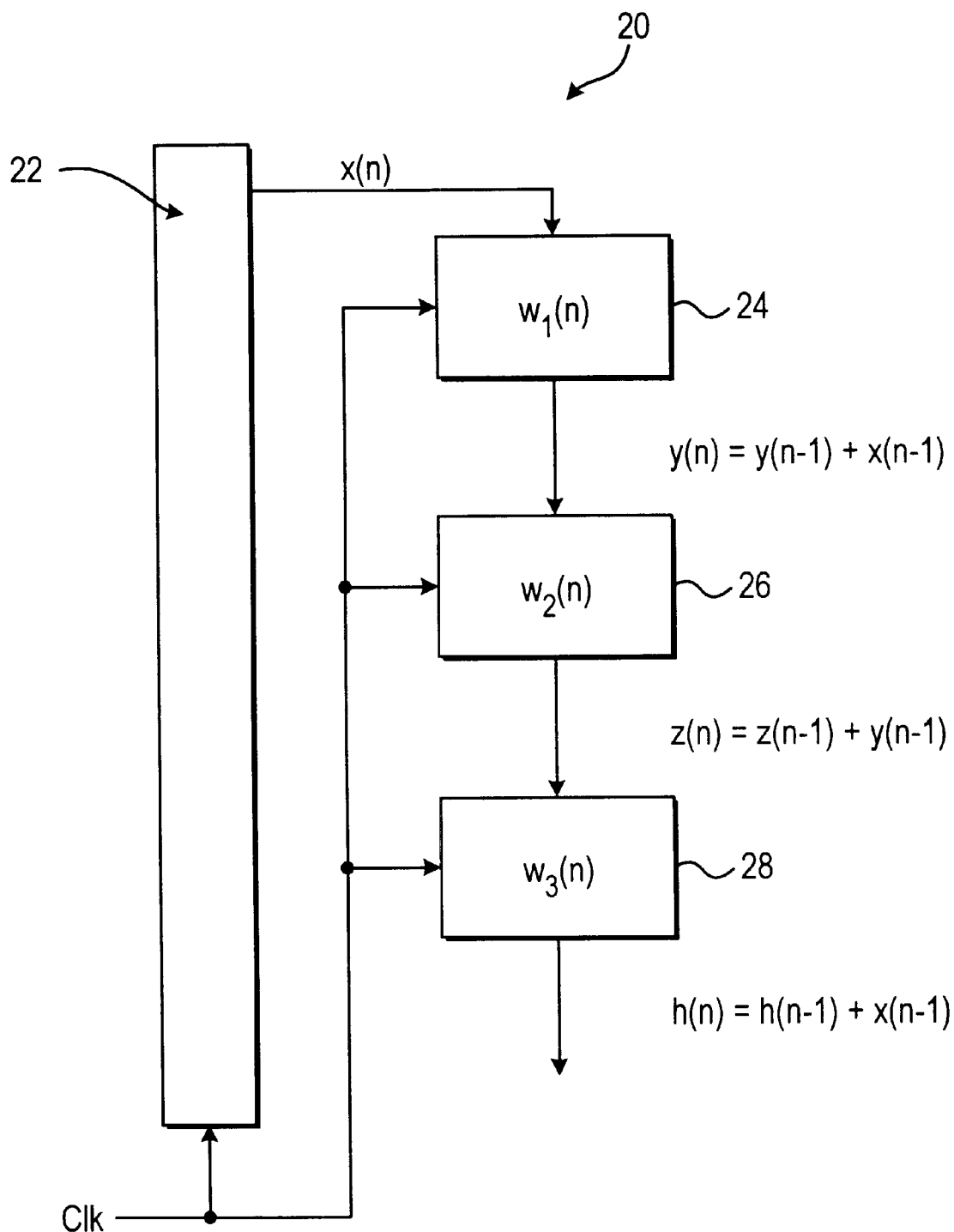
FIG. 3 is a block diagram of an exemplary architecture for an adder and accumulator of the present invention.

Referring to FIGS. 2 and 3, an exemplary architecture of a coefficient generator for a decimation filter having a $Sinc^4(N\omega T/2)$ frequency response is described, in which r=4, N=256, and L=1024. Blocks $W_1(n)$, $W_2(n)$ and $W_3(n)$ are discrete-time integrators that implement the recursive relations:

$$y(n)=y(n-1)+x(n-1), n=1, 2, \ldots, L \quad (9a)$$

$$y(0)=y_{init} \quad (9b)$$

$$z(n)=z(n-1)+y(n-1), n=1, 2, \ldots, L \quad (9c)$$

$$z(0)=z_{inst} \quad (9d)$$

$$h(n)=h(n-1)+z(n-1), n=1, 2, \ldots, L \quad (9e)$$

$$h(0)=h_{init} \quad (9f)$$

where y(n) and z(n) are intermediary sequences of length L. The initial values for the three sequences are defined as $y_{init}$, $z_{init}$ and $h_{init}$.

Note that the z-domain transfer function $w_m(z)$ corresponding to recursive relations (9a)–(9f) is given by $$w_m(z) = \frac{z^{-1}}{(1-z^{-1})} \quad (10)$$

The $z^{-1}$ term in the numerator of equation (10) corresponds to a one sample period T delay introduced by each of equations (9a), (9c) and 9e). Equation 10 is the product of the z-domain transfer function of a one sample period delay and an integrator transfer function. As a result of the delay term, sequence h(n) has a three sample period delay relative to sequence x(n). This delay is inconsequential for the described embodiments.

Figure 4A:
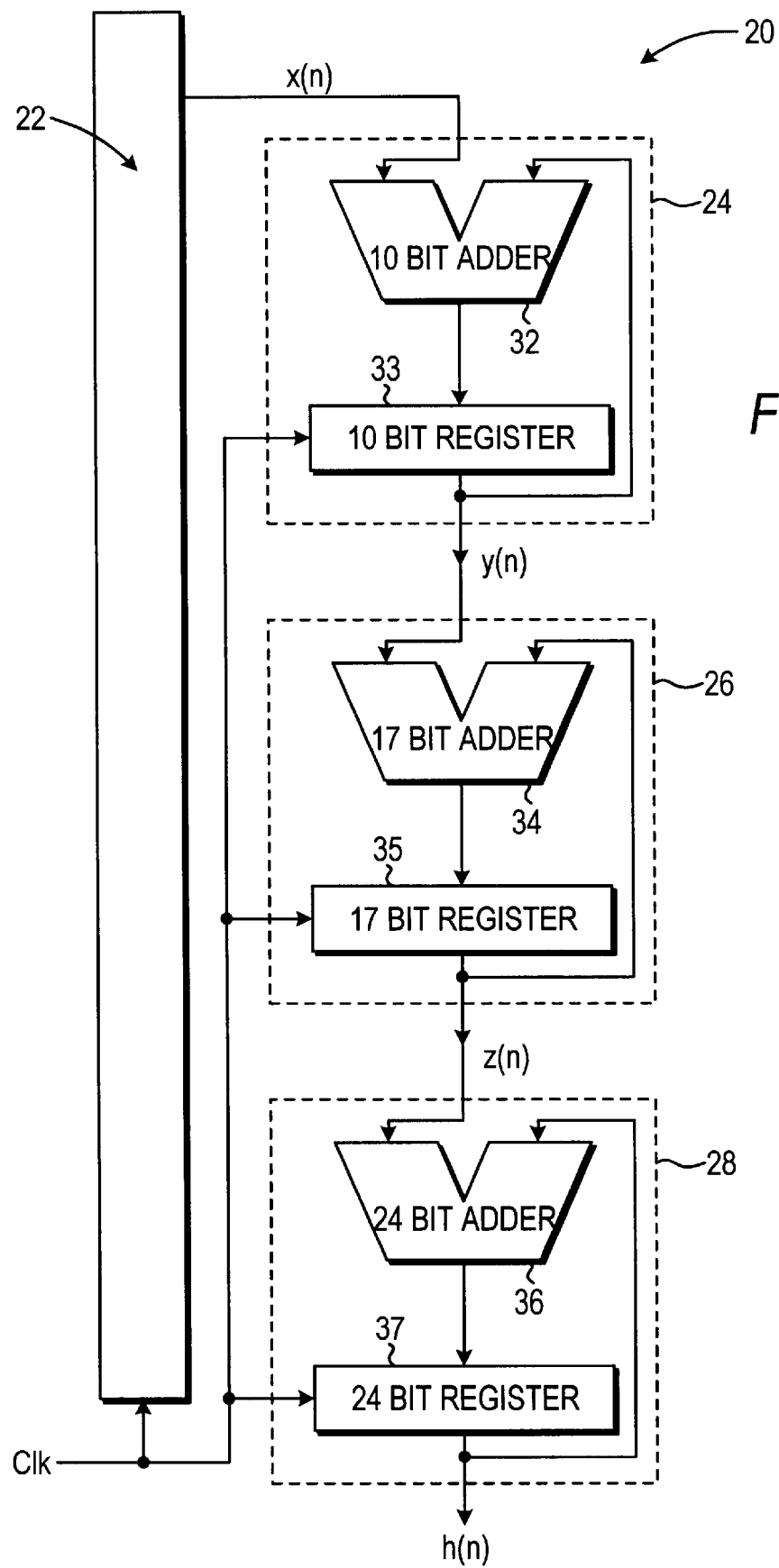
FIGS. 4A–4C are block diagrams of exemplary embodiments of a coefficient generator of the present invention.

Referring to FIG. 4A, an exemplary embodiment of a coefficient generator corresponding to the architecture shown in FIGS. 2 and 3 is described. Coefficient generator 20 includes system controller 22, multi-bit adders 32, 34 and 36, and accumulator registers 33, 35 and 37. System controller 22 governs the operation of coefficient generator 20. In particular, system controller 22 stores the current value of coefficient index n, initializes accumulator registers 33, 35 and 37 before startup (n=0) with the respective initial values $y_{init}$, $z_{init}$ and $h_{init}$, and controls the operation of multi-bit adders 32, 34 and 36 and accumulator registers 33, 35 and 37 as coefficient index n is incremented from 1 to L.

Multi-bit adders 32, 34 and 36 implement the above recursive relations, and accumulator registers 33, 35 and 37 store the values of the intermediary sequences y(n) and z(n), as well as output sequence h(n). Multi-bit adder 32 has a first input coupled to x(n), a second input coupled to the output y(n) of accumulator register 33, and an output coupled to the input of accumulator register 33. Multi-bit adder 34 has a first input coupled to y(n), a second input coupled to the output z(n) of accumulator register 35, and an output coupled to the input of accumulator register 35. Multi-bit adder 36 has a first input coupled to z(n), a second input coupled to the output h(n) of accumulator register 37, and an output coupled to the input of accumulator register 37.

In the embodiment shown in FIG. 4A, intermediary sequence x(n) and y(n) can be represented as 10-bit signed binary numbers. Multi-bit adder 32 can be implemented as a 10-bit signed binary adder, and accumulator register 33 can be 10 bits wide. Intermediary sequence z(n) can be represented as a 17-bit signed binary number. Multi-bit adder 34 can be implemented as a 17-bit signed binary adder, and accumulator register 35 can be 17 bits wide. Output sequence h(n), which is the filter coefficient sequence for a $Sinc^4(N\omega T/2)$ filter of length L=1024, can be represented as a 24-bit signed binary number. Multi-bit adder 36 can be implemented as a 24-bit signed binary adder, and accumulator register 37 can be 24 bits wide.

Input sequence x(n) can be stored in a memory or may be generated in real time as needed (e.g., by system controller 22). For many decimation filters of significant practical importance, input sequence x(n) is much more simple than sequence h(n), both with respect to the maximum word length of the individual values x(n) and with respect to the number of distinct values contained in the sequence. In the embodiment shown in FIG. 4A, system controller 22 partially decodes the 1024 states of the coefficient generator and creates input sequence x(n).

System controller 22 can be implemented as a 10 bit binary counter with 1024 distinct states s=0, 1, . . . , 1023. For continuous operation, the initial state 0 may immediately follow the last state 1023. Alternatively, system controller 22 may be implemented using a memory that stores coefficient sequence g(n), coupled to a discrete-time integrator that generates the sequence x(n). The discrete-time integrator may be implemented using the same adder/accumulator structure described above with respect to discrete-time integrators 24, 26 and 28.

Figure 4B:
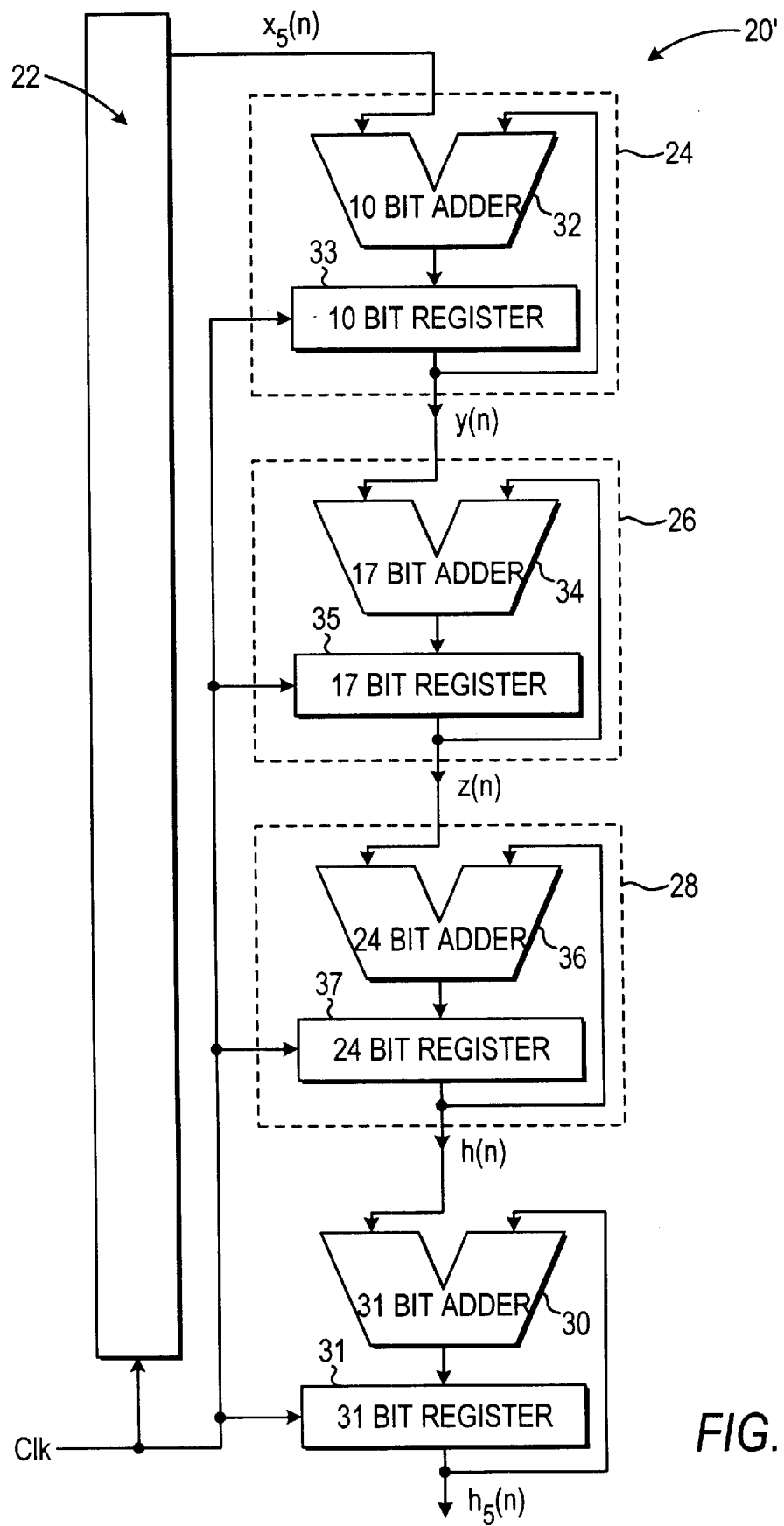
Figure 4C:
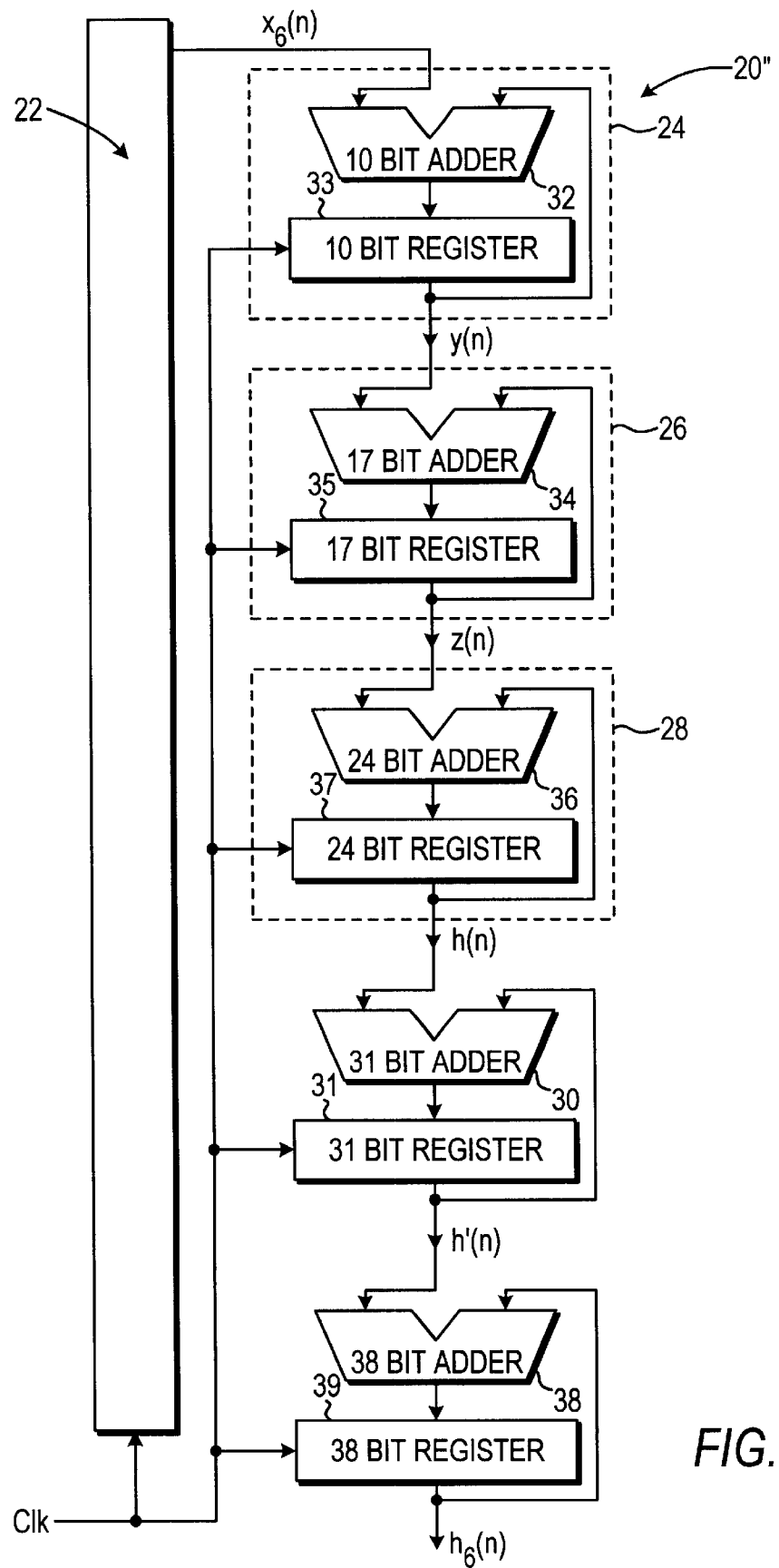

To generate the coefficient sequence for higher-order decimation filters, the circuit of FIG. 4A may be modified by adding additional multi-bit adder and accumulator register pairs, and using a predetermined input sequence x(n), as explained below. For example, FIG. 4B shows coefficient generator 20', which generates the coefficient sequence $h_5(n)$ for a $Sinc^5(N\omega T/2)$ filter. Circuit 20' may be derived based on circuit 20, by adding multi-bit adder 30 and accumulator register 31 and by generating a predetermined input sequence $x_5(n)$. Similarly, FIG. 4C shows coefficient sequence generator 20", which generates the coefficients $h_6(n)$ for a $Sinc^6(N\omega T/2)$ filter. Circuit 20" may be modified based on circuit 20' by adding multi-bit adder 38 and accumulator register 39 and by generating a predetermined input sequence $x_6(n)$.

Referring again to FIGS. 2 and 4A, system controller 22 can directly construct input sequence x(n)=x(1), x(2), . . . , x(1024), by decoding the internal states such that:

$$\begin{aligned} x(n) &= +1 \quad \text{if } 1 \leq n \leq 256 \\ &\phantom{=} -3 \quad \text{if } 257 \leq n \leq 512 \\ &\phantom{=} +3 \quad \text{if } 513 \leq n \leq 768 \\ &\phantom{=} -1 \quad \text{if } 769 \leq n \leq 1024 \end{aligned} \quad (11)$$

Coefficient generator 20 produces one filter coefficient h(n) for each pulse of clock signal Clk. That is, one cycle of clock Clk corresponds to one system state n. For FIR filters in which the filter length L is larger than the decimation factor N (L>N), a number of such generators may be operated in parallel with relative index delays to accommodate the convolution operation.

The initial values of the y, z and h sequences shall be $y_{init}=0$, $z_{inst}=0$ and $h_{init}=0$. Further, the final values of these sequences are also 0 because y(1024)=0, z(1024)=0 and h(1024)=0. Therefore, coefficient generator 20 can operate continuously, and the first coefficient h(1) of a new sequence can immediately follow the last coefficient h(1024) of the previous sequence without any reset action or additional delay for flushing the pipeline registers.

A $Sinc^4(N\omega T/2)$ filter provides a first null in the frequency response at a frequency $F_{null}=4*F_s/L=F_o$. For a number of practical applications (e.g., an analog-to-digital converter with line frequency rejection at both 50 Hz and 60 Hz for world wide markets), the decimation filter frequency response should provide multiple closed-spaced nulls in a relatively narrow range of frequencies. Such a filter also can be implemented in accordance with the principles of the present invention.

For example, using the notation set forth above, coefficients of a fourth-order decimation filter $h_d(n)$ having closely-spaced nulls at frequencies $F_s/232$ and $F_s/280$ may be generated using input sequence $x_d(n)$ that has a z-domain transfer function given by:

$$X_d(z) = \frac{(1-z^{-232})^2(1-z^{-280})^2}{(1-z^{-1})} = G_d(z)\left(\frac{1}{1-z^{-1}}\right) \quad (12)$$

By determining the discrete-time integration of the inverse z-transform of $G_d(z)$, input sequence $x_d(n)=x_d(1)$, $x_d(2), \ldots, x_d(1024)$ has the values:

$$\begin{aligned} x_d(n) = &+1 && \text{if } 1 \le n \le 232 \\ &-1 && \text{if } 233 \le n \le 280 \\ &-3 && \text{if } 281 \le n \le 464 \\ &-2 && \text{if } 465 \le n \le 512 \\ &+2 && \text{if } 513 \le n \le 560 \\ &+3 && \text{if } 561 \le n \le 744 \\ &+1 && \text{if } 745 \le n \le 792 \\ &-1 && \text{if } 793 \le n \le 1024 \end{aligned} \quad (13)$$

The filter $h_d(n)$ can be implemented using the circuits described above (FIG. 4A) by modifying system controller 22. The filter length L=1024, as well as the size of the multi-bit adders and accumulator registers remain the same, so that the only necessary modification is the state decoding inside system controller 22.

In accordance with principles of the present invention, many other filter types also can be constructed in a similar fashion. In general, FIR filter $h_g(n)$ having a z-domain transfer function that may be expressed as $$H_g(z) = W_1(z)W_2(z) \ldots W_{r-1}(z)X_g(z) \quad (14)$$

$$X_g(z) = \frac{G(z)}{(1-z^{-1})} \quad (15)$$

where $W_m(z)$, m=1, 2, ..., r-1, are defined in equation (4), G(z) may be expressed as set forth above in equation (6), and $X_g(z)$ is the z-transform of a corresponding input sequence $x_g(n)$, may be implemented in accordance with the principles of the present invention using an architecture similar to that shown in FIG. 4A.

Further, with minimum addition hardware complexity, the state decoding in system controller 22 can be changed at design time, at manufacturing time or during normal operation to modify the properties of the implemented filter.

Modifications can be made to the embodiment shown in FIG. 4A to further simplify the practical implementations for specific input sequences x(n) and coefficient sequences h(n). For example, in traditional adder-accumulator implementations, the lowest order carry input is not used. Using standard arithmetic coding techniques, the carry input to adder 24 can be used with input sequence x(n) to further simplify the hardware implementation.

Figure 5:
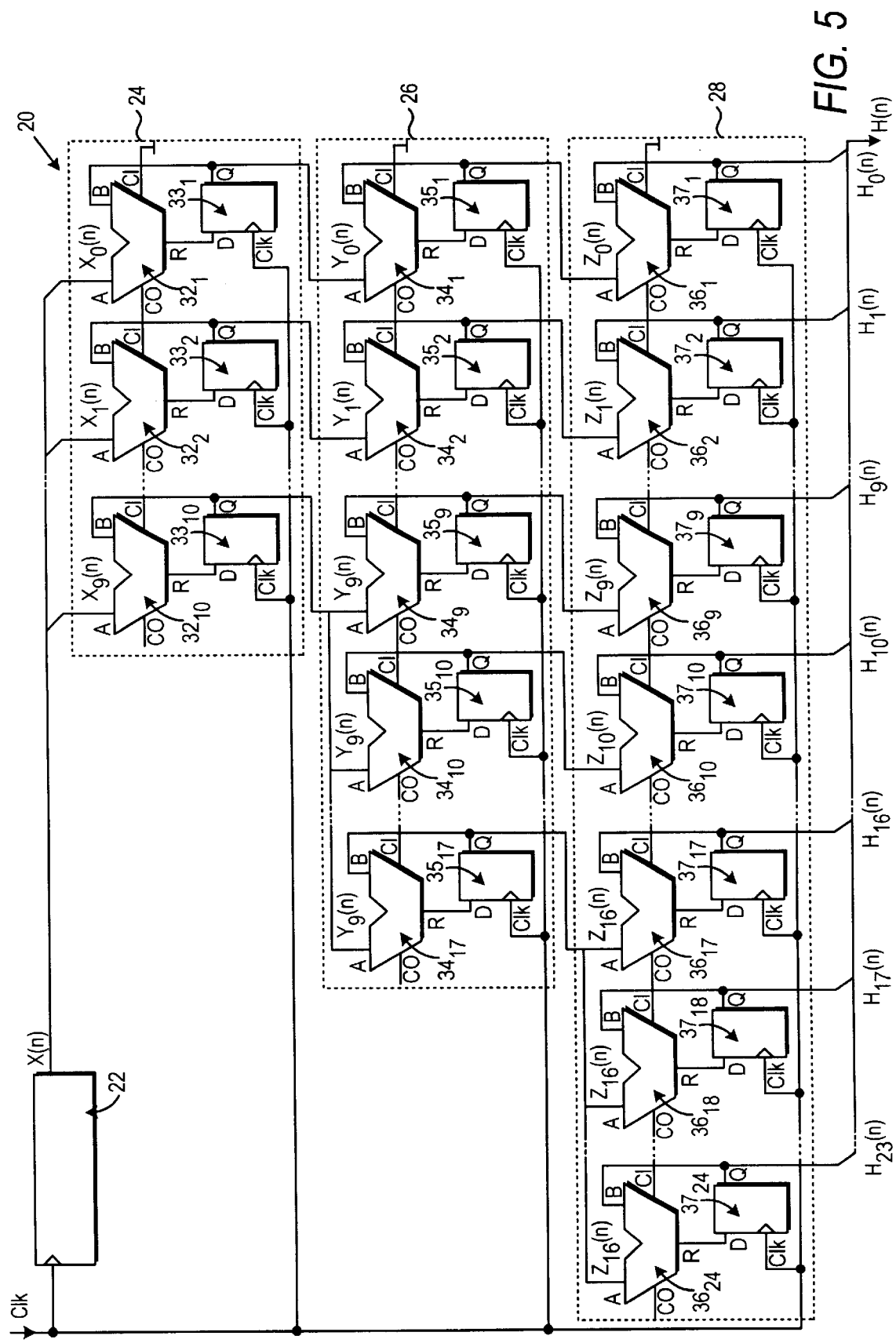
FIG. 5 is an exemplary circuit diagram of the embodiment of FIG. 4.

An exemplary embodiment of the structure shown in FIG. 4A is shown in FIG. 5. Coefficient generator 20 includes system controller 22, binary full adders $32_1$–$32_{10}$, $34_1$–$34_{17}$ and $34_1$–$36_{24}$, flip-flops $33_1$–$33_{17}$, $35_1$–$35_{10}$ and $37_1$–$37_{24}$.

System controller 22 uses system clock Clk to implement a 1024-state state machine that creates 10-bit input sequence X(n) where n=1, 2, ..., 1024, represents the coefficient index. Controller 22 can be implemented as a 10-bit binary counter, where each counter value j (j=0, 1, ..., 1023) corresponds to a coefficient index n=j+1.

As shown in FIG. 6, input sequence X(n) set forth in equation (11), above, can be generated by decoding bits 9 and 10 of binary counter j. In addition, for any coefficient index n=1, 2, ..., 1024, bit 0 of X(n) always should be 1, bit 1 of X(n) always should equal bit 10 of binary counter j, and all other bits of X(n) should equal bit 9 of binary counter j.

Referring again to FIG. 5, binary full adders $32_1$–$32_{10}$ implement the 10-bit adder 32, whereas flip-flops $33_1$–$33_{10}$ form the 10-bit accumulator register 33. Each one of binary full adders $32_1$–$32_{10}$ is paired with a unique one of flip-flops $33_1$–$33_{10}$.

Binary full adders $32_1$–$32_{10}$ each include inputs A and B and output R. Flip-flops $33_1$–$33_{10}$ each include input D, output Q and clock input Clk. Input A of full adder $32_i$, i=1, 2, ... 10, is coupled to bit i-1 of input sequence X(n), respectively. Input B of full adder $32_i$ is coupled to output Q of flip-flop $33_i$, i=1, 2, ... 10, respectively. Output R of full adder $32_i$ is coupled to input D of flip-flop $33_i$, i=1, 2, ... 10., respectively. For each count j, flip-flops $33_1$–$33_{10}$ each store one bit of intermediary sequence Y(n).

Binary full adders $34_1$–$34_{17}$ implement the 17-bit adder 34, whereas flip-flops $35_1$–$35_{17}$ form the 17-cib accumulator register 35. Each one of binary full adders $34_1$–$34_{17}$ is paired with a unique one of flip-flops $35_1$–$35_{17}$.

Binary full adders $34_1$–$34_{17}$ each include inputs A and B and output R. Flip-flops $35_1$–$35_{17}$ each include input D, output Q and clock input Clk. Input A of full adder $34_i$, i=1, 2, ... 17, is coupled to bit i-1 of sequence Y(n) (sign extended to 17 bits), respectively. Input B of full adder $34_i$ is coupled to output Q of flip-flop $35_i$, i=1, 2, ... 17, respectively. Output R of full adder $34_i$ is coupled to input D of flip-flop $35_i$, i=1, 2, ... 17, respectively. For each count j, flip-flops $35_1$–$35_{17}$ each store one bit of intermediary sequence Z(n).

Binary full adders $36_1$–$36_{24}$ implement the 24-bit adder 36, whereas flip-flops $37_1$–$37_{24}$ form the 24-bit accumulator register 37. Each one of binary full adders $36_1$–$36_{24}$ is paired with a unique one of flip-flops $37_1$–$37_{24}$.

Binary full adders $36_1$–$36_{24}$ each include inputs A and B and output R. Flip-flops $37_1$–$37_{17}$ each include input D, output Q and clock input Clk. Input A of full adder $36_i$, i=1, 2, ... 24, is coupled to bit i-1 of sequence Z(n) (sign-extended to 24 bits), respectively. Input B of full adder $36_i$ is coupled to output Q of flip-flop $37_i$, i=1, 2, ... 24, respectively. Output R of full adder $36_i$ is coupled to input D of flip-flop $37_i$, i=1, 2, ... 24, respectively. For each count j, flip-flops $37_1$–$37_{24}$ each form one bit of filter coefficient sequence H(n).

The exemplary embodiment shown in FIG. 5 generally requires control lines to initialize the various flip-flops (e.g. set/reset controls) before beginning to generate coefficient sequence H(n). System controller 22 can perform this initialization operation. As explained above, for the specific filter coefficient sequence used as an example here, the initial and final states of the accumulator registers involved are identical, and thus no initialization is required. A means for initializing all flip-flops at power-on is required. Means for implementing such power-on initialization are well-known and are not shown in FIG. 5.

Figure 7:
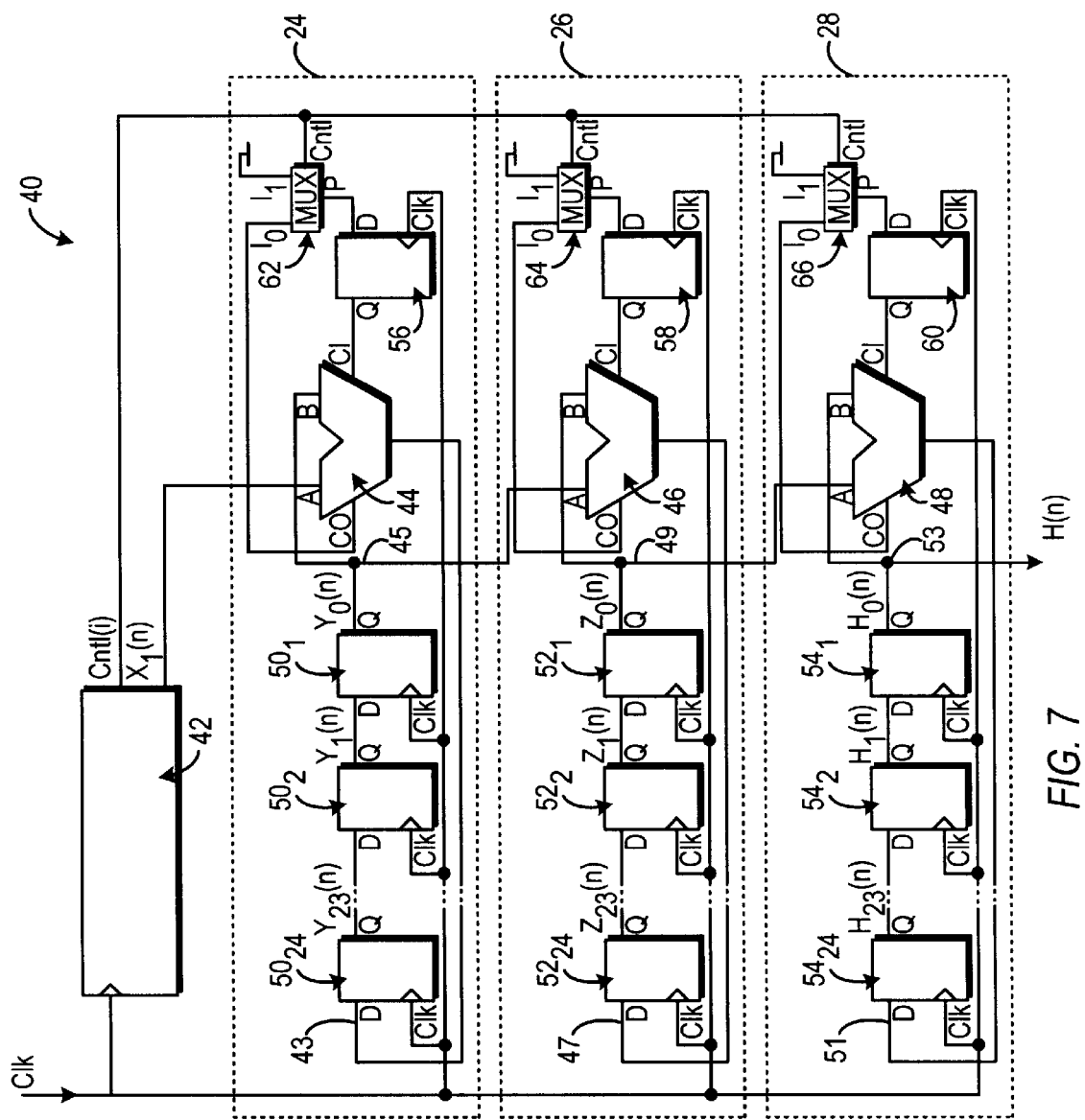
FIG. 7 is a circuit diagram of an alternative embodiment of a coefficient generator of the present invention.

The embodiment shown in FIG. 5 requires a large number of adders and flip-flops. Referring to FIG. 7, an alternative embodiment of a coefficient generator is described that uses bit-serial arithmetic. In particular, coefficient generator 40 includes system controller 42, binary full adders 44, 46 and 48, cascaded flip-flops $50_1$–$50_{24}$, $52_1$–$52_{24}$ and $54_1$–$54_{24}$, carry-save flip-flops 56, 58 and 60, and multiplexors 62, 64 and 66. System controller 42 receives clock input Clk, provides 24-bit input sequence $X_i(n)$, i=0, 2, ..., 23, n=1, 2, ..., 1024, and control signal Cntl(i) and governs the operation of coefficient generator 40.

Because the largest word length in the coefficient generator is 24 bits (for the H(n) sequence) the size of each of cascaded flip-flops $50_1$–$50_{24}$, $52_1$–$52_{24}$ and $54_1$–$54_{24}$, has been made 24 bits to increase implementation uniformity. Thus, the bit-length of coefficients X(n), Y(n), Z(n) and H(n) can be set to 24. Assuming that the coefficients are processed using a signed binary representation, the extension to 24 bits must be a signed extension.

Cascaded flip-flops $50_1$–$50_{24}$ each have input D, output Q and clock input Clk, and are coupled to form a 24-bit serial shift register having input 43 and output 45. Cascaded flip-flops $52_1$–$52_{24}$ each have input D, output Q and clock input Clk, and are coupled to form a 24-bit serial shift register having input 47 and output 49. Cascaded flip-flops $55_1$–$54_{24}$ each have input D, output Q and clock input Clk, and are coupled to form a 24-bit serial shift register having input 51 and output 53.

Adder 44 has input A coupled to $X_i(n)$, input B coupled to serial shift register output 45, output R coupled to serial shift register input 43, carry input CI coupled to carry-save flip-flop 56 output Q, and carry output CO coupled to multiplexor 62 first input $I_0$. Multiplexor 62 also has second input $I_1$ coupled to ground, control input Cntl coupled to Cntl(i) and output P coupled to carry-save flip-flop 56 input D. Carry-save flip-flop 56 receives clock input Clk.

Adder 46 has input A coupled to serial shift register output 45, input B coupled to serial shift register output 49, output R coupled to serial shift register input 47, carry input CI coupled to carry-save flip-flop 58 output Q, and carry output CO coupled to multiplexor 64 first input $I_0$. Multiplexor 64 also has second input $I_1$ coupled to ground, control input Cntl coupled to Cntl(i) and output P coupled to carry-save flip-flop 58 input D. Carry-save flip-flop 58 receives clock input Clk.

Adder 48 has input A coupled to serial shift register output 53, input B coupled to serial shift register output 49, output R coupled to serial shift register input 51, carry input CI coupled to carry-save flip-flop 60 output Q, and carry output CO coupled to multiplexor 66 first input $I_0$. Multiplexor 66 also has second input $I_1$ coupled to ground, control input Cntl coupled to Cntl(i) and output P coupled to carry-save flip-flop 60 input D. Carry-save flip-flop 60 receives clock input Clk.

Coefficient generator 40 provides 1024 24-bit coefficients one bit at a time. Thus, the total number of distinct states of system controller 42 must increase from L=1024 to 24*L= 24,576 states. If controller 42 is constructed using a binary counter, the size of this counter increases from 10 bits to 15 bits. In such an implementation, the 5 least significant bits of the counter operate modulo-24, and thus form current bit descriptor i where i=0, 1, ..., 23, whereas the 10 most significant bits operate as a full binary counter modulo 1024, where each counter value j (j=0, 1, ..., 1023) correspond to coefficient index n=j+1.

System controller 42 generates input sequence $X_i(n)$ one bit at a time. Any state s (s=0, 1, ..., 24,575) of system controller 42 can be written in the unique form s=(n−1)*24+i where n is the coefficient index, and i is the bit descriptor. During state s=(n−1)*24+i, system controller 42 produces the i-th bit of the n-th index of input sequence $X_i(n)$ and control signal Cntl(i), described below. Control signal Cntl (i) is only a function of bit descriptor i and only is HIGH for i=23.

Using a simple implementation of a 5-bit modulo-24 counter to create the least significant bits (bit 0 to bit 4) of state descriptor s, and of a 10-bit modulo-1024 counter to create the most significant bits (bit 5 to bit 14) of state descriptor s, the input sequence $X_i(n)$ corresponding to equation (11), above, can be generated as shown in FIG. 8.

Coefficient generator 40 provides sequence $Y_i(n)$ at serial shift register output 45, $Z_i(n)$ at serial shift register output 49, and coefficients $H_i(n)$ at serial shift register output 53. Because the three discrete-time systems introduce a three-sample delay as described above, during state s=(n−1)*24+i, coefficient generator 40 produces the i-th bit of the n−3rd index of output coefficient $H_i(n-3)$ of filter coefficient sequence H(n).

Coefficient generator 40 processes one bit at a time, beginning with the least significant bit of the current coefficient value. After all bits i of one coefficient of index n have been calculated, coefficient generator 40 next computes the coefficient of index n+1. While calculating the bits of one coefficient, the carry outputs CO of adders 44, 46 and 48 must be saved and propagated between successive bits. The carry output CO of adder 44 is stored by carry-save flip-flop 56, the carry output CO of adder 46 is stored by carry-save flip-flop 58, and the carry output CO of adder 48 is stored by carry-save flip-flop 60.

At the beginning of the calculation of a new coefficient, the carry-in value applied to carry input CI to adders 44, 46 and 48 must be "0", but the overflow from the previous coefficient calculation which is stored in carry-save flip-flops 56, 58 and 60 may not be "0". This problem is resolved by the control signal Cntl(i). System controller 42 generates Cntl(i), which is HIGH only when the most significant bit of a coefficient is calculated (i.e., for i=23). Otherwise, Cntl(i) is LOW.

Each of multiplexors 62, 64 and 66 operate as follows. When the signal on the Cntl input of a multiplexor is LOW, multiplexor first input $I_0$ is connected to multiplexor output P. When the signal on the Cntl input of a multiplexor is HIGH, multiplexor second input $I_1$ is connected to multiplexor output P. Thus, as shown in FIG. 6, when Cntl(i) is HIGH, multiplexors 62, 64 and 66 disconnect the D inputs of carry-save flip-flops 56, 58 and 60, respectively, from the carry output CO of adders 44, 46 and 48, respectively, and connect the D input to logic "0" levels.

System controller 42 also must provide a global initialization before the start of operations. The initialization control line usually drives the reset (or set) input of all the storage elements in the system (not shown).

A number of variations can be constructed based upon this architecture using well-known encoding and arithmetic transformations. For example, input $I_0$ of multiplexors 62, 64 and 66 alternatively may be connected to the corresponding output Q of carry-save flip-flops 56, 58 and 60, with output P of multiplexors 62, 64 and 66 connected to the corresponding carry input CI of adders 44, 46 and 48, and carry output CO of adders 44, 46 and 48 connected directly to the corresponding input D of flip-flops 56, 58 and 60. The operation of coefficient generator 40 is identical, except that Cntl(i) must be HIGH if and only if i=0.

Other possible alterative embodiments make use of the $I_1$ inputs of multiplexors 62, 64 and 66 in conjunction with the input sequence $X_i(n)$. Such an approach may result in specific hardware simplifications for certain input sequences.

The embodiment shown in FIG. 7 significantly reduces the number of binary adders at the expense of a high operating rate and additional storage elements. A further simplification and optimization can be achieved by interleaving the serial arithmetic operations. An interleaved factor of 2 is particularly efficient within physical layout constraints. Other interleaved factors also can be used depending upon the particularities of a specific hardware floor plan.

Figure 9:
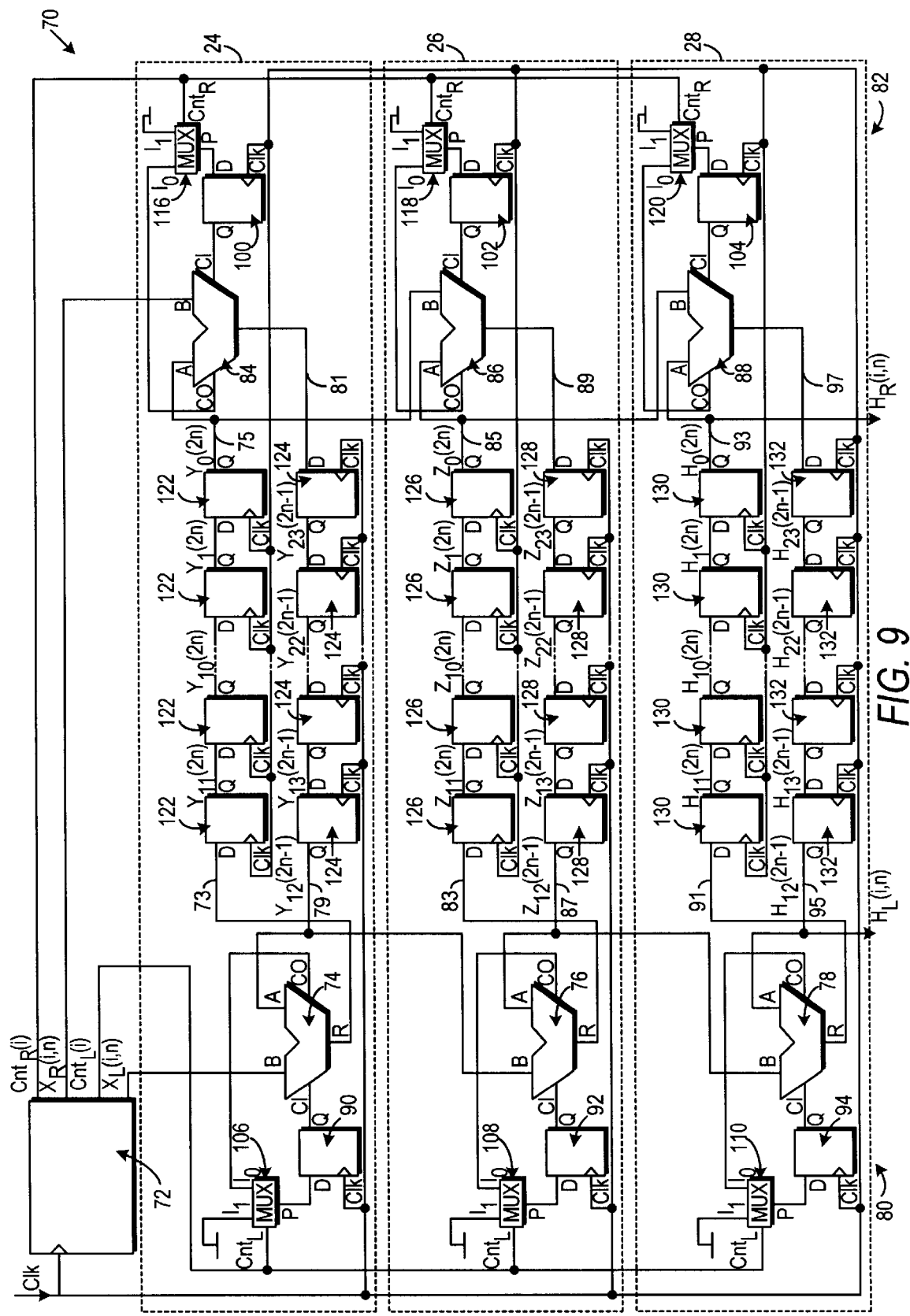
FIG. 9 is a circuit diagram of a second alternative embodiment of the coefficient generator of the present invention.

FIG. 9 shows a double-interleaved serial implementation of the coefficient generator shown in FIGS. 4, 5 and 7. In this embodiment, the number of adders and associated carry save registers and multiplexors has been doubled. The advantage of this approach is a doubling of the throughput (or a reduction in half of the operating frequency).

Coefficient generator 70 includes system controller 72, left side binary full adders 74, 76 and 78, right side binary full adders 84, 86 and 88, cascaded flip-flops 122, 124, 126, 128, 130 and 132, carry-save flip-flops 90, 92, 94, 100, 102 and 104, and multiplexors 106, 108, 110, 116, 118 and 120. System controller 72 receives clock input Clk, provides 12-bit input sequence $X_L(i,n)$, i=0, 2, . . . , 11, and 12-bit input sequence $X_R(i,n)$, i=0, 2, . . . , 11, n=1, 2, . . . , 1024, and control signals $Cnt_L(i)$ and $Cnt_R(i)$, and governs the operation of coefficient generator 70.

Cascaded flip-flops 122, 124, 126, 128, 130 and 132 each have input D, output Q and clock input Clk, and are coupled to form 12-bit serial shift registers having inputs 73, 81, 83, 89, 91 and 97, respectively, and outputs 75, 79, 85, 87, 93 and 95, respectively. For simplicity, in the following discussion, the terminology "serial shift register N" refers to the serial shift register formed from cascaded flip-flops N, where N=122, 124, 126, 128, 130 and 132.

Adder 74 has input B coupled to $X_L(i,n)$, input A coupled to serial shift register output 79, output R coupled to serial shift register input 73, carry input CI coupled to carry-save flip-flop 90 output Q, and carry output CO coupled to mutliplexor 106 first input $I_0$. Multiplexor 106 also has second input $I_1$ coupled to ground, control input Cntl coupled to $Cnt_L(i)$ and output P coupled to carry-save flip-flop 90 input D. Carry-save flip-flop 90 receives clock input Clk.

Adder 76 has input B coupled to serial shift register output 79, input A coupled to serial shift register output 87, output R coupled to serial shift register input 83, carry input CI coupled to carry-save flip-flop 92 output Q, and carry output CO coupled to mutliplexor 108 first input $I_0$. Multiplexor 108 also has second input $I_1$ coupled to ground, control input Cntl coupled to $Cnt_L(i)$ and output P coupled to carry-save flip-flop 92 input D. Carry-save flip-flop 94 receives clock input Clk.

Adder 78 has input B coupled to serial shift register output 87, input A coupled to serial shift register output 95, output R coupled to serial shift register input 91, carry input CI coupled to carry-save flip-flop 94 output Q, and carry output CO coupled to multiplexor 110 first input $I_0$. Multiplexor 110 also has second input $I_1$ coupled to ground, control input Cntl coupled to $Cnt_L(i)$ and output P coupled to carry-save flip-flop 94 input D. Carry-save flip-flop 94 receives clock input Clk.

Adder 84 has input B coupled to $X_R(i,n)$, input A coupled to serial shift register output 75, output R coupled to serial shift register input 81, carry input CI coupled to carry-save flip-flop 100 output Q, and carry output CO coupled to multiplexor 116 first input $I_0$. Multiplexor 116 also has second input $I_1$ coupled to ground, control input Cntl coupled to $Cnt_R(i)$ and output P coupled to carry-save flip-flop 100 input D. Carry-save flip-flop 100 receives clock input Clk.

Adder 86 has input B coupled to serial shift register output 75, input A coupled to serial shift register output 85, output R coupled to serial shift register input 89, carry input CI coupled to carry-save flip-flop 102 output Q, and carry output CO coupled to multiplexor 118 first input $I_0$. Multiplexor 118 also has second input $I_1$ coupled to ground, control input Cntl coupled to $Cnt_R(i)$ and output P coupled to carry-save flip-flop 102 input D. Carry-save flip-flop 102 receives clock input Clk.

Adder 88 has input B coupled to serial shift register output 85, input A coupled to serial shift register output 93, output R coupled to serial shift register input 97, carry input CI coupled to carry-save flip-flop 104 output Q, and carry output CO coupled to multiplexor 120 first input $I_0$. Multiplexor 120 also has second input $I_1$ coupled to ground, control input Cntl coupled to $Cnt_R(i)$ and output P coupled to carry-save flip-flop 104 input D. Carry-save flip-flop 104 receives clock input Clk.

Adders 74, 76 and 78, together with carry save flip-flops 90, 92 and 94 and multiplexors 106, 108 and 110, perform the arithmetic operations upon odd index coefficients Y(2n−1), Z(2n−1) and H(2n−1), for n=1, 2, . . . , 512, in a similar manner to the circuit in FIG. 4A, and generate even index coefficients Y(2n), Z(2n) and H(2n) as results.

Similarly, adders 84, 86 and 88, together with carry save flip-flops 100, 102 and 104 and multiplexors 116, 118 and 120, perform the arithmetic operations upon even index coefficients Y(2n), Z(2n) and H(2n), where n=1, 2, . . . , 512, in a similar manner to the circuit in FIG. 4A, and generate odd index coefficients Y(2n+1), Z(2n+1) and H(2n+1) as results. The choice of left/right side correspondence to odd/even index is arbitrary.

FIG. 9 shows coefficient generator 70 at the instant when right side 82 operates on the least significant bit of even coefficients Y(2n), Z(2n) and H(2n), to produce the least significant bit of odd index coefficients Y(2n+1), Z(2n+1) and H(2n+1).

The first 12 least significant bits of even order coefficient Y(2n) already have been calculated and are stored in serial shift register 122. For the subsequent 12 states, the first 12 least significant bits of odd order coefficient Y(2n+1), which are the result of the operations performed by adder 84, are stored in serial shift register 124, where they displace the last 12 most significant bits of the previous odd order coefficient Y(2n−1).

During this operation, the carry output CO of adder 84 produced in the current state is stored in carry-save flip-flop 100 and is used as the carry input CI to adder 84 in the following state.

In the previous state (used to calculate $Y_{23}(2n-1)$), the content of carry-save flip-flop 100 has been initialized by disconnecting its input D from the carry output CO of adder 84, and connecting it instead to a logic "0" level. For the remaining 23 states, while calculating the 23 least significant bits Y(2n+1), carry-save flip-flop 100 input D is reconnected to the carry output CO of adder 84. The connect/disconnect operation is performed by multiplexor 116. When multiplexor control signal $Cnt_R(i)$ is HIGH, flip-flop 100 input D is connected to the logic "0" level, and when $Cnt_R(i)$ is LOW, flip-flop 100 input D is connected to carry output CO of adder 84.

In a similar manner, adders 86 and 88, carry-save flip-flops 102 and 104 and multiplexors 118 and 120, generate the least significant bits of odd order coefficients Z(2n+1) and H(2n+1), which are stored in serial shift register 128 and 132, respectively, where they displace the last 12 most significant bits of the previous odd order coefficient Z(2n−1) and H(2n−1), respectively.

Simultaneously, left side 80 is in the middle (bit 12) of the calculation that uses odd index coefficients Y(2n−1), Z(2n−1) and H(2n−1) to produce even index coefficients Y(2n), Z(2n) and H(2n).

The last 12 most significant bits of odd order coefficient Y(2n−1) already have been calculated and are located in serial shift register 124. In the subsequent 12 states, the last 12 most significant bits of even order coefficient Y(2n), which are the result of the operations performed by adder 74, are stored in serial shift register 122, where they displace the first 12 least significant bits of the same even order coefficient Y(2n).

During this operation, carry output CO of adder 74 produced in the current state is stored in carry-save flip-flop 90 and is used as the carry input CI to adder 74 in the following state.

At the time when $Y_{23}(2n-2)$ was calculated (13 states ago), the content of carry-save flip-flop 90 was initialized by disconnecting its input D from the carry output CO of adder 74 and connecting it instead to a logic "0" level. For the remaining 23 states, while calculating the 23 least significant bits Y(2n), the carry-save flip-flop 90 input D is reconnected to the carry output CO of adder 74. Multiplexor 106 performs the connect/disconnect operation. When multiplexor control signal $Cnt_L(i)$ is HIGH, flip-flop 90 input D is connected to the logic "0" level, and when $Cnt_L(i)$ is LOW, flip-flop 90 input D is connected to the carry output CO of adder 74.

In a similar manner, adders 76 and 78, carry-save flip-flops 92 and 94 and multiplexors 108 and 110, generate the most significant bits of even order coefficients Z(2n) and H(2n), which are stored in serial shift registers 126 and 130, respectively, where they displace the first 12 least significant bits of the same even order coefficient Z(2n) and H(2n), respectively.

Figure 10:
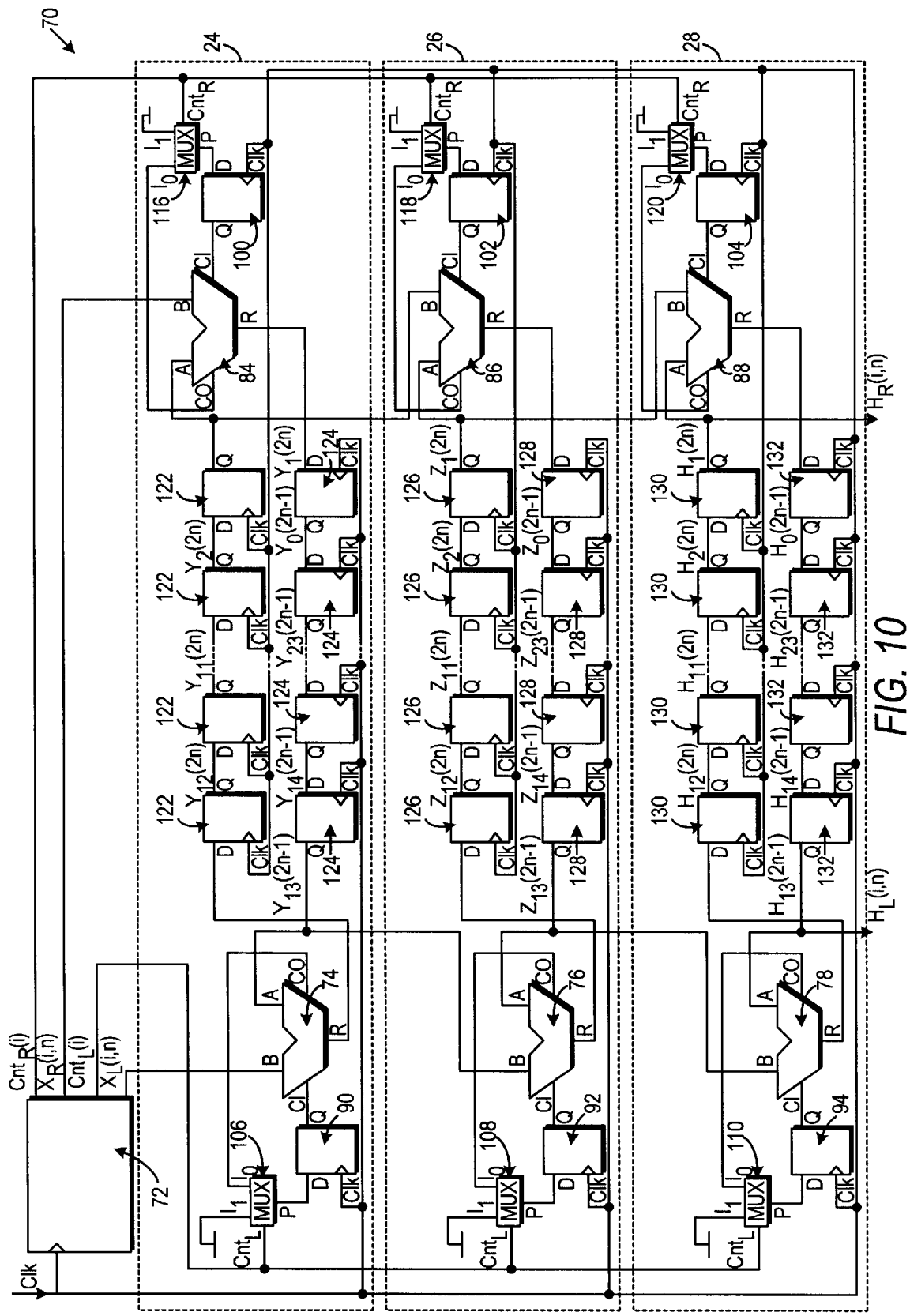
FIG. 10 is the circuit of FIG. 9 after one additional clock cycle.

To better describe the operation of this system, FIG. 10 shows the system state one clock cycle following the state shown in FIG. 9.

The embodiment shown in FIG. 9 only requires half the number of distinct states as the embodiment of FIG. 7 because two different bit calculations are simultaneously performed during each state. System controller 72 therefore must have 24*(L/2)=12,288 distinct states. System controller 72 can be implemented as a 14 bit binary counter, in which the 5 least significant bits of the counter operate modulo-24, and thus form a current bit descriptor i, where i=0, 1, ..., 23, whereas the 9 most significant bits operate as a full binary counter modulo-512, where each counter value j (j=0, 1, ..., 511) corresponds to a coefficient index n=j+1.

Any state s (s=0, 1, ..., 12,287) of system controller 72 can be written in the unique form s=(n−1)*24+i, where n is the coefficient index and i is the bit descriptor. During the state s=(n−1)*24+i, system controller 72 constructs two bits of input sequence X(n)—$X_R(i,n)$ and $X_L(i,n)$, each bit being part of a different coefficient word. These bits are constructed as follows:

$$\text{for all } i \quad X_L(i, n) = X_i(2n - 1)$$

$$\text{if } i \geq 12 \quad X_R(i, n) = X_{i-12}(2n)$$

$$\text{if } i < 12 \quad X_R(i, n) = X_{i+12}(2n - 2)$$

X(n) is defined as shown in FIG. 6, but sign-extended to 24 bits.

During the state s=(n−1)*24+i, system controller 51 constructs two control bits $Cnt_R(i)$ and $Cnt_L(i)$ which are only a function of bit descriptor i. The construction rules for these bits are: $Cnt_R(i)$ is HIGH if and only if i=11. $Cnt_L(i)$ is HIGH if and only if i=23.

During state s=(n−1)*24+i, coefficient generator 70 produces two bits of filter coefficient H(n)—$H_R(i,n)$ and $H_L(i, n)$, each bit being part of a different coefficient word. The indexing rules for these bits are:

$$\text{for all } i \quad H_L(i, n) = H_i(2n - 1)$$

$$\text{if } i \geq 12 \quad H_R(i, n) = H_{i-12}(2n)$$

$$\text{if } i < 12 \quad H_R(i, n) = H_{i+12}(2n - 2)$$

System controller 72 also must perform a global initialization before the start of operations. The initialization control line usually drives the reset (or set) input of all the storage elements in the system (not shown).

For the bit-serial embodiments shown in FIGS. 7 and 9, the size of all accumulator registers has been made equal to obtain a uniform structure. This requires that the Y(n) and Z(n) accumulator registers increase in size, and also requires additional system states. By using a parallel combination of interleaved serial arithmetic blocks, the increase in accumulator register size and number of system states can be reduced.

Figure 11:
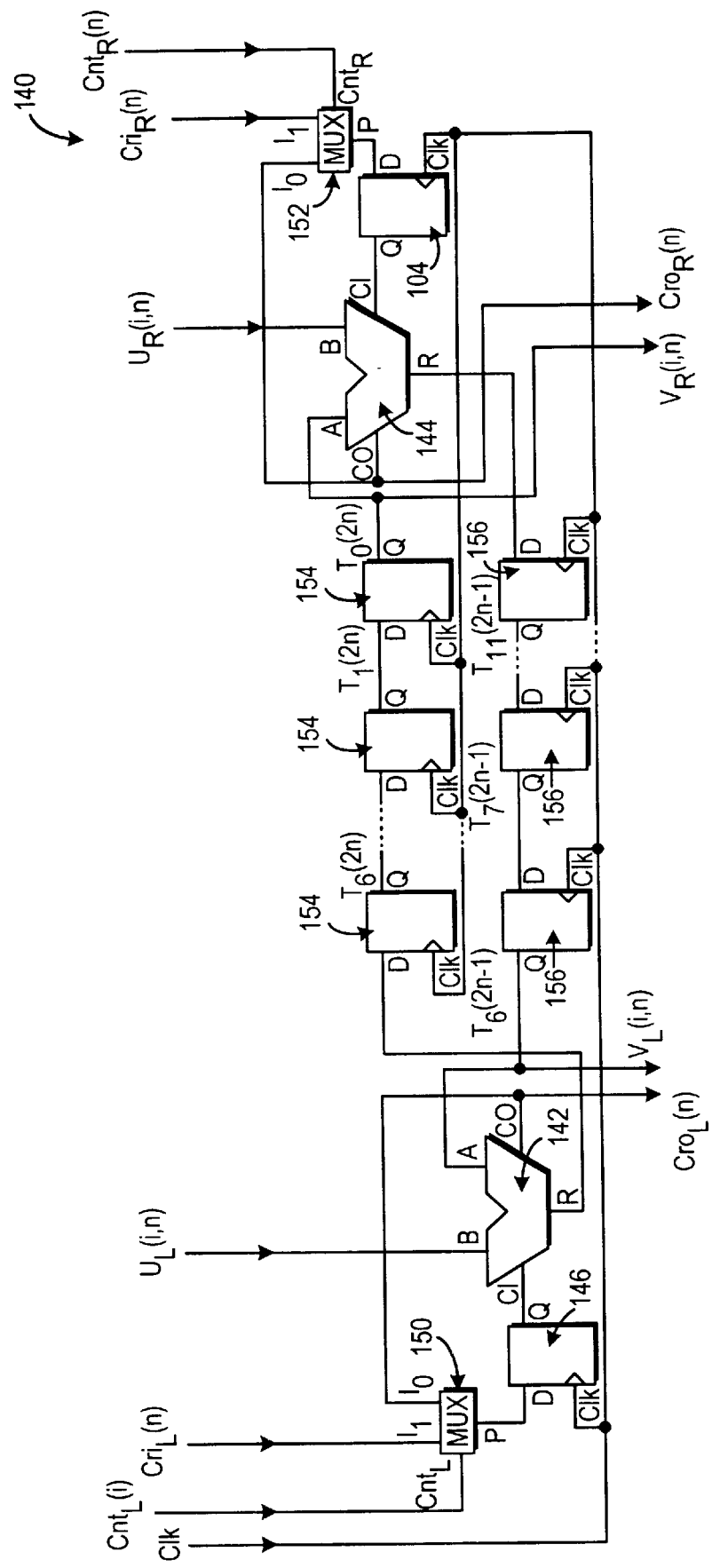
FIG. 11 is an circuit diagram of an exemplary interleaved serial arithmetic block of the present invention.

Referring to FIG. 11, interleaved serial arithmetic block (ISAB) 140 is described. ISAB 140 includes adders 142 and 144, carry save flip-flops 144 and 146, multiplexors 150 and 152, and shift registers 154 and 156.

To implement a $Sinc^4(N\omega T/2)$ coefficient generator, an ISAB with a total of 12 flip-flops in serial shift registers 154 and 156 is selected. The number of flip-flops in such a block can be increased or decreased as necessary for specific coefficient generators.

ISAB 140 operates in a manner similar to that of the previous serial embodiments. The number of distinct states equals the number of flip-flops in the shift registers, thus it is 12. The 12 states are defined by the bit descriptor i, i=0, 1, ..., 11. In addition, ISAB 140 has four single bit inputs $U_R(i,n)$, $U_L(i,n)$, $Cri_R(n)$ and $Cri_L(n)$, two single bit control inputs $Cnt_R(i)$ and $Cnt_L(i)$, four single bit outputs $V_R(i,n)$, $V_L(i,n)$, $Cro_R(n)$, $Cro_L(n)$ and one clock input Clk.

By arbitrary choice, adder 144 uses the current even index coefficient $T_i(2n)$ stored in shift registers 154, the current even order input $U_R(i,2n)$ and the current even order carry $Cri_R(2n)$ and creates the next odd order coefficient $T_i(2n+1)$. Adder 144 sums the current internal coefficient bit $T_i(2n)$ with the current input coefficient $U_R(i,2n)$ and the current value present in carry-save register 148. Output R of adder 144 is the resultant coefficient bit $T_i(2n+1)$ Even order carry $Cri_R(2n)$ is loaded into carry-save flip-flop 148 when right control signal $Cnt_R(i)$ is HIGH. This occurs during the processing of the most significant bit of the previous even order coefficient $T_{11}(2n-2)$.

Right multiplexor 152 disconnects input D of carry-save flip-flop 148 from carry output CO of adder 144 and connects it to even order carry input signal $Cri_R(2n)$ when right control signal $Cnt_R(i)$ is HIGH. $Cnt_R(i)$ is HIGH if and only if i=5.

For i=5, the carry output CO of adder 144 is not saved in the internal carry-save register, but may be used outside this block as the one bit $Cro_R(n)$ output for parallel block interconnection.

The newly created odd order coefficient $T_i(2n+1)$ is shifted into serial shift register 156 where it replaces the previous odd order coefficient $T_i(2n-1)$.

Adder 142 uses the current odd index coefficient $T_i(2n-1)$ stored in the shift registers 156, and current odd order input $U_L(i,2n-1)$ and the current odd order carry $Cri_L(2n-1)$ and creates the next even order coefficient $T_i(2n)$. Adder 142 sums the current internal coefficient bit $T_i(2n-1)$ with the current input coefficient $U_L(i,n)$ and the current value present in carry-save register 146. The adder sum output is the resultant coefficient bit $T_i(2n)$.

The odd order carry $Cri_L(2n-1)$ is loaded into carry-save flip-flop 146 when the left control signal $Cnt_L(i)$ is HIGH. This occurs during the processing of the most significant bit of the previous odd order coefficient $T_{11}(2n-3)$.

Left multiplexor 150 disconnects input D of carry-save flip-flop 146 from carry output CO of adder 142 and connects it to the odd order carry input signal $Cri_L(2n-1)$ when left control signal $Cnt_L(i)$ is HIGH. $Cnt_L(i)$ is HIGH if and only if i=11.

For i=11, the carry output CO of adder 142 is not saved in the internal carry-save register but may be used outside this block as the one bit $Cro_L(n)$ output for parallel block interconnection.

The newly created even order coefficient $T_i(2n)$ is shifted into shift register 154 where it replaces the previous even order coefficient $T_i(2n-2)$.

For any state i=0, 1, . . . , 11, and coefficient index n>0, the input and output single bit signals are indexed as follows:

| | |
|---|---|
| for all i | $U_L(i,n) = U_i(2n-1)$ |
| for i ≥ 6 | $U_R(i,n) = U_{i-6}(2n)$ |
| for i < 6 | $U_R(i,n) = U_{i+6}(2n-2)$ |
| for i = 11 | $Cri_L(n) = Cri(2n+1)$ |
| for i = 5 | $Cri_R(n) = Cri(2n)$ |
| for all i | $V_L(i,n) = V_i(2n-1)$ |
| for i ≥ 6 | $V_R(i,n) = V_{i-6}(2n)$ |
| for i < 6 | $V_R(i,n) = V_{i+6}(2n-2)$ |
| for i = 11 | $Cro_L(n) = Cro(2n-1)$ |
| for i = 5 | $Cro_R(n) = Cro(2n-2)$ |

For every transition from i=11 to i=0, coefficient index n is incremented by 1.

Figure 12:
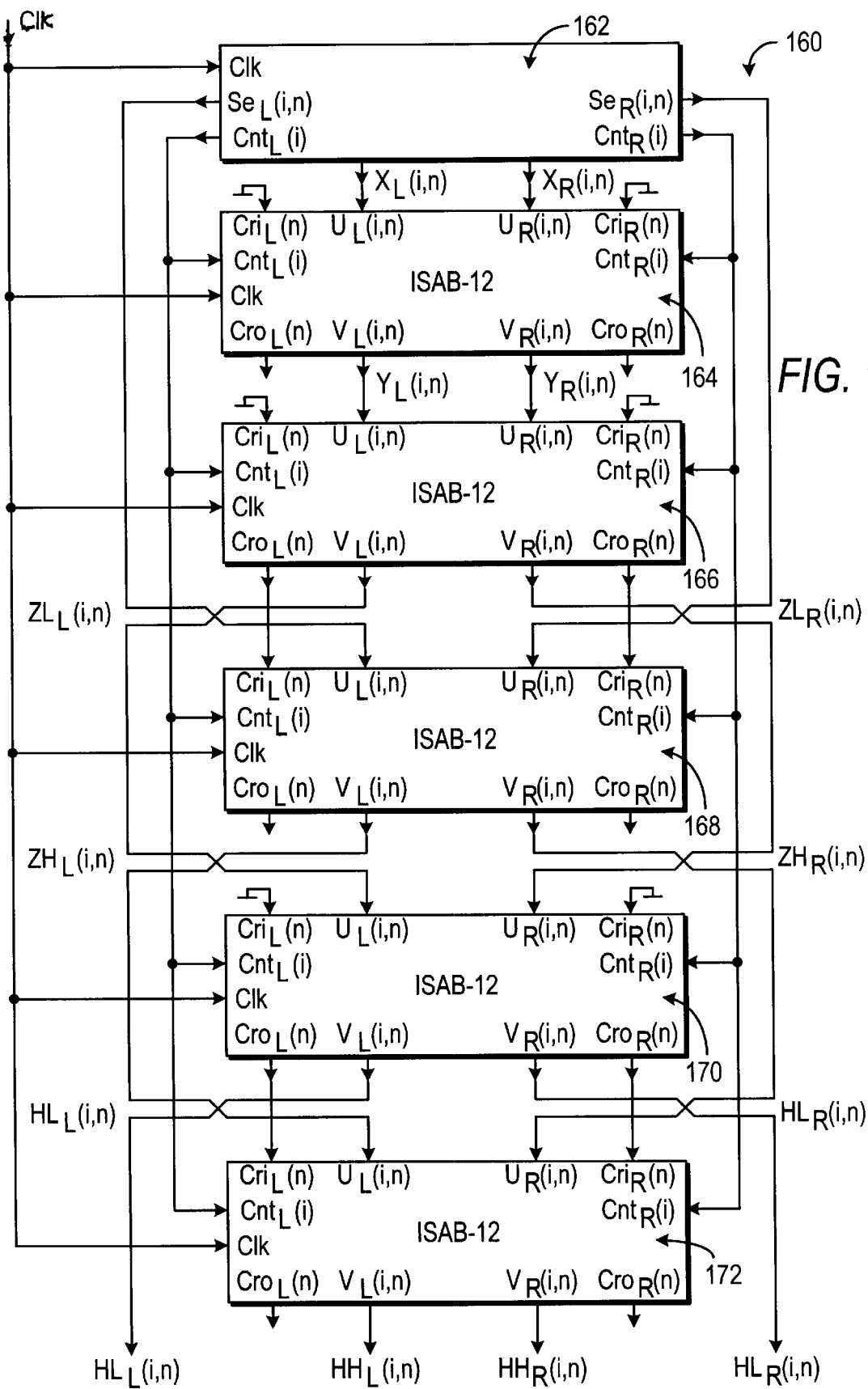
FIG. 12 is a circuit diagram of a third alternative embodiment of a coefficient generator of the present invention.

Referring to FIG. 12, another alternative embodiment of a coefficient generator for a $Sinc^4(N\omega T/2)$ is described that uses parallel combinations of ISABs. Coefficient generator 160 includes system controller 162 and ISABs 164, 166, 168, 170 and 172. Each ISAB in this embodiment has internal serial shift registers (154 and 156 in FIG. 11) constructed from a total of 12 flip-flops, and are thus labeled ISAB-12.

In this embodiment, register Y(n) is extended from 10 bits to only 12 bits and is implemented using ISAB 164. Register Z(n) is extended from 17 bits to 24 bits and is implemented using ISAB 166 and 168 operating in parallel. ISAB 166 calculates the 12 least significant bits of the Z(n) coefficient, and ISAB 168 calculates the 12 most significant bits of the Z(n) coefficient. Register H(n) remains 24 bits and is implemented using ISAB 170 and 172. ISAB 170 calculates the 12 least significant bits of the H(n) coefficient, and ISAB 172 calculates the 12 most significant bits of the H(n) coefficient.

System controller 162 directs the operation of coefficient generator 160. As in previously described embodiments, system controller 162 increments the system state for every clock pulse received from clock signal Clk. For a filter length L=1024, this implementation requires 12*(L/2)=6,144 distinct states. System controller 162 can be implemented as a 13-bit binary counter, in which the 4 least significant bits of the counter operates modulo-12, and thus form a current bit descriptor i, where i=0, 1, . . . , 11, whereas the 9 most significant bits operate as a full binary counter modulo-512, where each counter value j (j=0, 1, . . . , 511) corresponds to a coefficient index n=j+1.

Any state s (s=0, 1, . . . , 6,144) of system controller 162 can be written in the unique form s=(n-1)*12+i, where n is the coefficient index and i is the bit descriptor.

In this embodiment, only the 12 least significant bits of the intermediary coefficient Y(n) are calculated. Because Y(n) can be both positive and negative, when it is added to the 24 bit intermediary coefficient Z(n), it must be sign extended. The sign extension information must be provided at the $U_R(i,n)$ and $U_L(i,n)$ inputs of ISAB 168, which processes the 12 most significant bits of Z(n). For a general implementation, the sign extension bit can be created from the most significant bit of Y(n) present at the $Y_R(i,n)$ and $Y_L(i,n)$ outputs of ISAB 164 by using a flip-flop and a multiplexor.

Alternatively, as in FIG. 12, system controller 162 recreates the sign extension information. Because the values of coefficients Y(n) are well-defined for any system state s, system controller 162 creates the binary signals $Se_R(i,n)$ and $Se_L(i,n)$, which contain the sign extension information for Y(n).

During the state s=(n-1)*12+i, system controller 162 creates the following binary signals:

| | |
|---|---|
| for all i | $X_L(i,n) = X_i(2n-1)$ |
| for i ≥ 6 | $X_R(i,n) = X_{i-6}(2n)$ |
| for i < 6 | $X_R(i,n) = X_{i+6}(2n-2)$ |

X(n) is defined as shown in FIG. 6, but sign-extended to 12 bits.

Additionally, for all $i$, for $\quad 0 < n \leq 172 \quad Se_L(i, n) = 0$ for $\quad 172 < n \leq 343 \quad Se_L(i, n) = 1$ for $\quad 343 < n \leq 512 \quad Se_L(i, n) = 0$ for $i \geq 6$ for $\quad 0 < n \leq 172 \quad Se_R(i, n) = 0$ for $\quad 172 < n \leq 342 \quad Se_R(i, n) = 1$ for $\quad 342 < n \leq 512 \quad Se_R(i, n) = 0$ for $i < 6$ for $\quad 0 < n \leq 173 \quad Se_R(i, n) = 0$ for $\quad 173 < n \leq 343 \quad Se_R(i, n) = 1$ for $\quad 343 < n \leq 512 \quad Se_R(i, n) = 0$ $Cnt_L(i)$ is HIGH if and only if i=11, and $Cnt_R(i)$ is HIGH if and only if i=5.

During the state s=(n-1)*12+i, coefficient generator 160 produces four bits of output sequence H(n)=$HL_L(i,n)$, $HL_R(i,n)$, $HH_L(i,n)$ and $HH_R(i,n)$, each bit being part of a different coefficient word. The indexing rules for these bits are:

| | |
|---|---|
| for all i | $HL_L = H_i\ (2n-1)$ |
| for all i | $HH_L = H_{i+12}\ (2n-3)$ |
| for $i \geq 6$ | $HL_R = H_{i-6}\ (2n)$ |
| for $i < 6$ | $HL_R = H_{i+6}\ (2n-2)$ |
| for $i \geq 6$ | $HH_R = H_{i-6}\ (2n-2)$ |
| for $i < 6$ | $HL_R = H_{i+6}\ (2n-4)$ |

FIR Filter with $Sinc^4(N\omega T/2)$ Coefficient Generator

During the filtering operation, the coefficient sequence H(n) of length L produced by the coefficient generator is multiplied with L successive samples of the filter input stream $SIG_{in}$ to create one sample of the filter output stream $SIG_{out}$ through the well-known process of convolution. Further, it is well-established that if the filter decimation factor N is less than the filter length L, multiple such multiplication operations may have to take place simultaneously with proper index synchronization. For simplicity, a single such multiplication operation is described.

In many applications involving oversampling converters, the samples that form the $SIG_{in}$ sequence have only two distinct values (i.e., a 1 bit binary representation). As a result, the multiplication operation is reduced to a logic AND operation. This configuration is quite simple, but through parallel connections and proper synchronization, it can be expanded to handle multi-bit encoded input streams.

Figure 13:
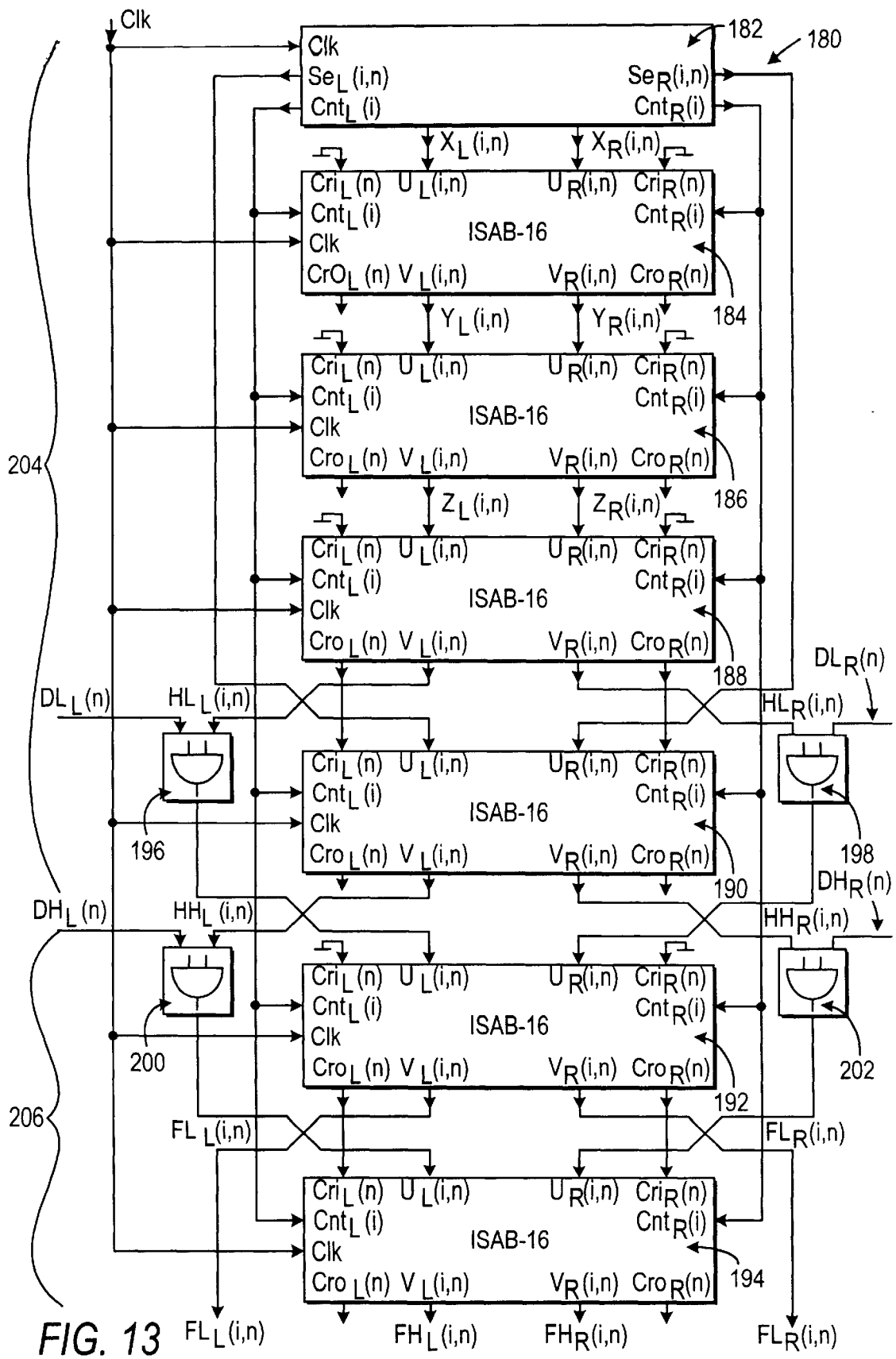
FIG. 13 is a circuit diagram of an exemplary FIR filter implementing an exemplary coefficient generator of the present invention.

FIG. 13 shows a $Sinc^4(N\omega T/2)$ FIR filter embodiment using a coefficient generator similar to the one described above to process single-bit input streams. In particular, FIR filter 180 includes (1) coefficient generator 204, comprised of system controller 182 and ISABs 184, 186, 188 and 190; multipliers 196, 198, 200 and 202; and (3) filter adder-accumulator 206, comprised of ISABs 192 and 194. The filter length is again L=1024. The size of adder-accumulator 206 necessary to calculate and store the convolution result is 32 bits.

The uniform coefficient generator and filter structure is implemented using ISABs with internal shift registers (154 and 156 in FIG. 11) constructed with a total of 16 flip-flops, and thus labeled ISAB-16.

Register Y(n) is extended from 10 bits to 16 bits and is implemented by ISAB 184. Register Z(n) contained previously a 16-bit plus sign value. Its size is reduced to 16 bits and it is implemented by ISAB 186.

Register H(n) is extended from 24 to 32 bits and is implemented by ISAB 188 for the least significant 16 bits and by ISAB 190 for the most significant 16 bits.

Similar to the embodiment described in FIG. 12, the 16 bit Z(n) coefficients must be sign extended for the addition with the 32 bit coefficients H(n) in ISAB 190. The sign bit has been completely eliminated from the Z(n) accumulator register (and thus its size has been reduced from 17 to 16 bits) and it is now generated by system controller 182. The $Se_L(i,n)$ and $Se_R(i,n)$ binary outputs produced by system controller 182 provide the necessary Z(n) sign information into ISAB 190.

Coefficient generator 204 creates 4 distinct bits of 4 different filter coefficients in every state $HL_L(i,n)$, $HL_R(i,n)$, $HH_L(i,n)$, $HH_R(i,n)$. These bits are multiplied in blocks 196, 198, 200 and 202 with input sequence $SIG_{in}=DL_L(i,n)$, $DL_R(i,n)$, $DH_L(i,n)$ and $DH_R(i,n)$. When input sequence $SIG_{in}$ is encoded using only one bit per sample, each one of multipliers 196, 198, 200 and 202 can be implemented using a combinatorial logic circuit, such as a 2-input AND logic gate as shown in FIG. 13.

The 32 bit filter adder-accumulator 206 is implemented using ISAB 192 for the 16 least significant bits and ISAB 194 for the 16 most significant bits. By synchronizing its operation with the coefficient generator, the coefficient bits $HL_L(i,n)$, $HL_R(i,n)$, $HH_L(i,n)$, $HH_R(i,n)$ immediately can be processed without additional delay or conversion logic. System controller 182 using the same control signals as for coefficient generator 204 governs the operation of filter adder-accumulator 206.

System controller 182 must define s=16*(1024/2)=8192 distinct states, and can be constructed as a 13 bit binary counter. System controller 182 can be implemented as a 13-bit binary counter, in which the 4 least significant bits of the counter operate modulo-16, and thus form a current bit descriptor i, where i=0, 1, . . . , 15, whereas the 9 most significant bits operate as a full binary counter modulo-512, where each counter value j (j=0, 1, . . . 511) corresponds to a coefficient index n=j+1. Any system state s can be written in the unique form s=(n−1)*16+i.

During state s=(n−1)*16+i, system controller 182 creates the following binary signals:

| | |
|---|---|
| for all i | $X_L\ (i,n) = X_i\ (2n-1)$ |
| for $i \geq 8$ | $X_R\ (i,n) = X_{i-8}\ (2n)$ |
| for $i < 8$ | $X_R\ (i,n) = X_{i+8}\ (2n-2)$ |

X(n) is defined as shown in FIG. 6, but sign-extended to 16 bits.

Additionally, for all $i$, for $\quad 0 < n \leq 1 \quad Se_L(i, n) = 1$ for $\quad 1 < n \leq 257\ Se_L(i, n) = 0$ for $257 < n \leq 512\ Se_L(i, n) = 1$ for $i \geq 8$ for $\quad 0 < n \leq 1\ Se_R(i, n) = 1$ for $\quad 1 < n \leq 257\ Se_R(i, n) = 0$ for $257 < n \leq 512\ Se_R(i, n) = 1$ for $i < 8$ for $\quad 0 < n \leq 2\ Se_R(i, n) = 1$ for $\quad 2 < n \leq 258\ Se_R(i, n) = 0$ for $258 < n \leq 512\ Se_R(i, n) = 1$ $Cnt_L(i)$ is HIGH if and only if i=15, and $Cnt_R(i)$ is HIGH if and only if i=7.

During state s=(n−1)*12+i, filter 180 uses four bits of the input sequence $DL_L(n)$, $DL_R(n)$, $DH_L(n)$ and $DH_R(n)$ and produces four bits of the output sequence $SIG_{OUT}=FL_L(i, n)$, $FL_R(i, n)$, $FH_L(i, n)$ and $FH_R(i, n)$. The indexing rules for these bits are:

for all $i$    $DL_L(n) = D(2n-1)$ for all $i$    $DH_L(n) = D(2n-3)$ for $i \geq 8$    $DL_R(n) = D(2n)$ for $i < 8$    $DL_R(n) = D(2n-2)$ for $i \geq 8$    $DH_R(n) = D(2n-2)$ for $i < 8$    $DL_R(n) = D(2n-4)$ for all $i$    $FL_L(i, n) = F_i(2n-1)$ for all $i$    $FH_L(i, n) = F_{i+12}(2n-3)$ for $i \geq 8$    $FL_R(i, n) = F_{i-8}(2n)$ for $i < 8$    $FL_R(i, n) = F_{i+8}(2n-2)$ for $i \geq 8$    $FH_R(i, n) = F_{i-8}(2n-2)$ for $i < 8$    $FL_R(i, n) = F_{i+8}(2n-4)$ Persons skilled in the art further will recognize that the circuitry of the present invention may be implemented using circuit configurations other than those shown and discussed above. All such modifications are within the scope of the present invention, which is limited only by the claims which follow.

What is claimed is:

1. An apparatus for generating a plurality of coefficients h(n) for a r-th order finite impulse response digital filter, the digital filter having a z-domain transfer function comprising the product of a first polynomial, a second polynomial and r-1 third polynomials, the first polynomial comprising the z-transform of a predetermined discrete-time sequence g(n), the second polynomial and the r-1 third polynomials each comprising a z-domain transfer function of a discrete-time integrator, the apparatus comprising:

input circuitry for generating a discrete-time sequence x(n), the sequence x(n) comprising the discrete-time integral of the sequence g(n); and a cascade of r-1 discrete-time integrators, the cascade comprising an input and an output, the input coupled to receive the sequence x(n), and the output providing the plurality of coefficients h(n).

2. The apparatus of claim 1, wherein the r-1 third polynomials each comprise the product of the z-domain transfer function of a one sample period delay and the z-domain transfer function of a discrete-time integrator.

3. The apparatus of claim 1, wherein the input circuitry comprises a memory.

4. The apparatus of claim 1, wherein the input circuitry comprises a binary counter.

5. The apparatus of claim 1, wherein each of the r-1 discrete-time integrators comprise an input and an output.

6. The apparatus of claim 5, wherein:

the cascade further comprises a first discrete-time integrator, an r-1st discrete-time integrator, and r-3 intermediate discrete-time integrators;

the input of the first discrete-time integrator comprises the input of the cascade;

the output of the r-1st discrete-time integrator comprises the output of the cascade; and the intermediate discrete-time integrators are coupled between the first and the r-1st discrete-time integrator, the input of each intermediate discrete-time integrator coupled to the output of an immediately preceding discrete-time integrator, the output of each intermediate discrete-time integrator coupled to the input of an immediately succeeding discrete-time integrator.

7. The apparatus of claim 6, wherein each of the r-1 discrete-time integrators comprise an adder having first and second inputs and an output, and an accumulator register having an input and an output, the first input of the adder comprising the input of the discrete-time integrator, the output of the accumulator register comprising the output of the discrete-time integrator, the second input of the adder coupled to the output of the accumulator register, and the input of the accumulator register coupled to the output of the adder.

8. The apparatus of claim 7, wherein the adder comprises a multi-bit adder.

9. The apparatus of claim 8, wherein the multi-bit adder comprises a plurality of binary full adders.

10. The apparatus of claim 7, wherein the accumulator register comprises a multi-bit register.

11. The apparatus of claim 10, wherein the multi-bit register comprises a plurality of flip-flops.

12. The apparatus of claim 7, wherein the adder comprises a plurality of binary full adders and the accumulator register comprises a plurality of flip-flops.

13. The apparatus of claim 12, wherein each of the binary full adders is paired with a unique one of the flip-flops.

14. The apparatus of claim 5, wherein each of the r-1 discrete-time integrators comprise a binary full adder, a serial shift register, a carry-save flip-flop and a multiplexor.

15. The apparatus of claim 14, wherein:

the binary full adder comprises first and second inputs and an output, the first input of the binary full adder comprising the input of the discrete-time integrator; and the serial shift register comprises an input coupled to the output of the binary full adder and an output coupled to the second input of the binary full adder, the output of the serial shift register comprising the output of the discrete-time integrator.

16. The apparatus of claim 15, wherein:

the input circuitry further provides a control signal that has a first state and a second state;

the binary full adder further comprises a carry input and a carry output;

the multiplexor comprises first and second inputs, a control input and an output, the first input of the multiplexor coupled to the carry output, the second input of the multiplexor coupled to ground, the control input of the multiplexor coupled signal, the output of the multiplexor coupled to the first input of the multiplexor when the control signal is in the first state, the output of the multiplexor coupled to second input of the multiplexor when the control signal is in the second state; and The carry-save flip-flop comprises an input coupled to the output of the multiplexor and an output coupled to the carry input.

17. The apparatus of claim 5, wherein each of the r-1 discrete-time integrators comprise first and second binary full adders, first and second serial shift registers, first and second carry-save flip-flops and first and second multiplexors.

18. The apparatus of claim 17, wherein:

the input circuitry generates first and second portions of the sequence x(n);

the first binary full adder comprises first and second inputs and an output, the first input of the first binary adder coupled to receive the first portion of the sequence x(n);

the second binary full adder comprises first and second inputs and an output, the first input of the second binary adder coupled to receive the second portion of the sequence x(n);

the first serial shift register comprises a first input coupled to the output of the first binary full adder and an output coupled to the second input of the second binary full adder; and the second serial shift register comprises an input coupled to the output of the second binary full adder and an output coupled to the second input of the first binary full adder.

19. The apparatus of claim 18, wherein:

the input circuitry further provides first and second control signals that each have a first state and a second state;

the first and second binary full adders each further comprise a carry input and a carry output;

the first carry-save flip-flop comprises an input and an output, the output of the first carry save flip-flop coupled to the carry input of the first binary full adder;

the second carry-save flip-flop comprises an input and an output, the output of the second carry-save flip-flop coupled to the carry input of the second binary full adder;

the first multiplexor comprises a first and second inputs, a control input and an output, the first input of the first multiplexor coupled to the carry output of the first binary full adder, the second input of the first multiplexor coupled to ground, the control input of the first multiplexor coupled to the first control signal, the first output of the first multiplexor coupled to the input of the first carry-save flip-flop, the first input of the first multiplexor coupled to the output of the first multiplexor when the first control signal is in the first state, the second input of the first multiplexor coupled to the output of the first multiplexor when the first control signal is in the second state; and the second multiplexor comprises first and second inputs, a control input and an output, the first input of the second multiplexor coupled to the carry output of the second binary full adder, the second input of the second multiplexor coupled to ground, the control input of the second multiplexor coupled to the first control signal, the first output of the second multiplexor coupled to the input of the second carry-save flip-flop, the first input of the second multiplexor coupled to the output of the second multiplexor when the first control signal is in the first state, the second input of the second multiplexor coupled to the output of the second multiplexor when the first control signal is in the second state.

20. An apparatus for generating a plurality of coefficients h(n) for an r-th order finite impulse response digital filter, the digital filter having a z-domain transfer function comprising the product of a first polynomial, a second polynomial and r-1 third polynomials, the first polynomial comprising the z-transform of a predetermined discrete-time sequence g(n), the second polynomial and the r-1 third polynomials each comprising a z-domain transfer function of a discrete-time integrator, the apparatus comprising:

input circuitry for generating first and second portions of a discrete-time sequence x(n), the sequence x(n) comprising the discrete-time integral of the sequence g(n); and a cascade of interleaved serial arithmetic blocks, the cascade comprising first and second inputs and first and second outputs, the first input coupled to receive the first portion of sequence x(n), the second input coupled to receive the second portion of sequence x(n), the first output providing a first portion of the plurality of coefficients h(n), the second output providing a second portion of the plurality of coefficients h(n).

21. The apparatus of claim 20, wherein:

the input circuitry further provides first and second sign extend outputs;

the cascade further comprises third and fourth outputs, and first, second, third, fourth and fifth interleaved serial arithmetic blocks, the third output providing a third portion of the plurality of coefficients h(n), the fourth output providing a fourth portion of the plurality of coefficients h(n), each of the interleaved serial arithmetic blocks having first and second inputs and first and second outputs;

the first input of the first interleaved serial arithmetic block comprises the first input of the cascade, the second input of the first interleaved serial arithmetic block comprises the second input of the cascade;

the first output of the first interleaved serial arithmetic block is coupled to the first input of the second interleaved serial arithmetic block, the second output of the first interleaved serial arithmetic block is coupled to the second input of the second interleaved serial arithmetic block;

the first sign extend output is coupled to the first input of the third interleaved serial arithmetic block, the second sign extend output is coupled to the second input of the third interleaved serial arithmetic block;

the first output of the second interleaved serial arithmetic block is coupled to the first input of the fourth interleaved serial arithmetic block, the second output of the second interleaved serial arithmetic block is coupled to the second input of the fourth interleaved serial arithmetic block;

the first output of the third interleaved serial arithmetic block is coupled to the first input of the fifth interleaved serial arithmetic block, the second output of the third interleaved serial arithmetic block is coupled to the second input of the fifth interleaved serial arithmetic block;

the first output of the fourth interleaved serial arithmetic block provides the first portion of the plurality of coefficients h(n), the second output of the fourth interleaved serial arithmetic block provides the second portion of the plurality of coefficients h(n); and the first output of the fifth interleaved serial arithmetic block provides the third portion of the plurality of coefficients h(n), the second output of the fifth interleaved serial arithmetic block provides the fourth portion of the plurality of coefficients h(n).

22. The apparatus of claim 21, wherein each of the interleaved serial arithmetic blocks is a 12-bit interleaved serial arithmetic block.

23. An apparatus for generating the coefficients of a finite impulse response digital filter.

24. A finite impulse response digital filter for filtering a discrete-time input sequence $SIG_{IN}$ to provide a discrete-time output sequence $SIG_{OUT}$, the filter comprising:

a sequence generator circuit that provides at a first output a first portion of a predetermined discrete-time coefficient sequence x(n) and that provides at a second output a second portion of the coefficient sequence x(n);

a cascade of interleaved serial arithmetic blocks, the cascade comprising a first input coupled to the first output of the sequence generator and a second input coupled to the second output of the sequence generator, the cascade providing at a first output a first portion of a plurality of coefficients h(n) of the digital filter, and providing at a second output a second portion of the coefficients h(n);

first and second combinatorial logic circuits each comprising first and second inputs and an output, the first input of the first combinatorial logic circuit coupled to the first output of the cascade, the second input of the first combinatorial logic circuit coupled to receive a first portion of the input sequence $SIG_{IN}$, the first input of the second combinatorial logic circuit coupled to the second output of the cascade, the second input of the second combinatorial logic circuit coupled to receive a second portion of the input sequence $SIG_{IN}$;

a convolution circuit comprising a first input coupled to the output of the first combinatorial logic circuit, and a second input coupled to the output of the second combinatorial logic circuit, the convolution circuit providing at a first output a first portion of the output sequence $SIG_{OUT}$, and providing at a second output a second portion of the output sequence $SIG_{OUT}$.

25. The digital filter of claim 24, wherein the convolution circuit comprises an interleaved serial arithmetic block.

26. The digital filter of claim 24, wherein each of the combinatorial logic circuits is an AND gate.

27. The digital filter of claim 24, wherein:

the sequence generator circuit further provides first and second sign extend outputs;

the cascade further provides at a third output a third portion of the plurality of coefficients h(n), and provides at a fourth output a fourth portion of the plurality of coefficients h(n);

the cascade further comprises first, second, third and fourth interleaved serial arithmetic blocks, and the convolution circuit further comprises fifth and sixth interleaved serial arithmetic blocks, each interleaved serial arithmetic block having first and second inputs and first and second outputs;

the digital filter further comprises third and fourth combinatorial logic circuits each comprising first and second inputs and an output, the first input of the third combinatorial logic circuit coupled to the third output of the cascade, the second input of the third combinatorial logic circuit coupled to receive a third portion of the input sequence $SIG_{IN}$, the first input of the fourth combinatorial logic circuit coupled to the fourth output of the cascade, the second input of the fourth combinatorial logic circuit coupled to receive a fourth portion of the input sequence $SIG_{IN}$;

the convolution circuit further comprises a third input coupled to the output of the third combinatorial logic circuit, and a fourth input coupled to the output of the fourth combinatorial logic circuit, the convolution circuit further providing at third output a third portion of the output sequence $SIG_{OUT}$, and providing at a fourth output a fourth portion of the output sequence $SIG_{OUT}$;

the first input of the first interleaved serial arithmetic block comprises the first input of the cascade, the second input of the first interleaved serial arithmetic block comprises the second input of the cascade;

the first output of the first interleaved serial arithmetic block is coupled to the first input of the second interleaved serial arithmetic block, the second output of the first interleaved serial arithmetic block is coupled to the second input of the second interleaved serial arithmetic block;

the first output of the second interleaved serial arithmetic block is coupled to the first input of the third interleaved serial arithmetic block, the second output of the second interleaved serial arithmetic block is coupled to the second input of the third interleaved serial arithmetic block;

the first output of the third interleaved serial arithmetic block comprises the first output of the cascade, the second output of the third interleaved serial arithmetic block comprises the second output of the cascade;

the first sign extend output is coupled to the first input of the fourth interleaved serial arithmetic block, the second sign extend output is coupled to the second input of the fourth interleaved serial arithmetic block;

the first output of the fourth interleaved serial arithmetic block comprises the third output of the cascade, the second output of the fourth interleaved serial arithmetic block comprises the fourth output of the cascade;

the output of the first combinatorial logic circuit is coupled to the first input of the fifth interleaved serial arithmetic block, the output of the second combinatorial logic circuit is coupled to the second input of the fifth interleaved serial arithmetic block, the output of the third combinatorial logic circuit is coupled to the first input of the sixth interleaved serial arithmetic block, the output of the fourth combinatorial logic circuit is coupled to the second input of the sixth interleaved serial arithmetic block; and the first output of the fifth interleaved serial arithmetic block comprises the first portion of the output sequence $SIG_{OUT}$, the second output of the fifth interleaved serial arithmetic block comprises the second portion of the output sequence $SIG_{OUT}$, the first output of the sixth interleaved serial arithmetic block comprises the third portion of the output sequence $SIG_{OUT}$, and the second output of the sixth interleaved serial arithmetic block comprises the fourth portion of the output sequence $SIG_{OUT}$.

28. The digital filter of claim 27, wherein each of the combinatorial logic circuits is an AND gate.

29. The digital filter of claim 27, wherein each of the interleaved serial arithmetic blocks is a 16-bit interleaved serial arithmetic block.

30. A method for generating a plurality of coefficients h(n) for an r-th order finite impulse response digital filter, the digital filter having a z-domain transfer function comprising the product of a first polynomial, a second polynomial and r-1 third polynomials, the first polynomial comprising the z-transform of a predetermined discrete-time sequence g(n), the second polynomial and the r-1 third polynomials each comprising a z-domain transfer function of a discrete-time integrator, the method comprising:

providing first and second portions of a discrete-time sequence x(n), the sequence x(n) comprising the discrete-time integral of the sequence g(n); and providing the first and second portions of the sequence x(n) to first and second inputs of a cascade of interleaved serial arithmetic blocks, the cascade comprising a first output providing a first portion of the plurality of coefficients h(n), and comprising a second output providing a second portion of the plurality of coefficients h(n).

* * * * *